United States Patent
Yang

(10) Patent No.: US 11,004,716 B2
(45) Date of Patent: May 11, 2021

(54) ELECTROSTATIC CHUCK ASSEMBLY AND SEMICONDUCTOR MANUFACTURING APPARATUS INCLUDING THE SAME

(71) Applicant: SAMSUNG ELECTRONICS CO., LTD., Suwon-si (KR)

(72) Inventor: Song-yi Yang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 773 days.

(21) Appl. No.: 15/787,940

(22) Filed: Oct. 19, 2017

(65) Prior Publication Data

US 2018/0122680 A1     May 3, 2018

(30) Foreign Application Priority Data

Oct. 31, 2016    (KR) ........................ 10-2016-0143422

(51) Int. Cl.
    *H01L 21/683*     (2006.01)
    *H01J 37/32*     (2006.01)
    *H01L 21/67*     (2006.01)

(52) U.S. Cl.
CPC .... *H01L 21/6833* (2013.01); *H01J 37/32642* (2013.01); *H01J 37/32697* (2013.01); *H01J 37/32715* (2013.01); *H01J 37/32724* (2013.01); *H01J 37/32908* (2013.01); *H01L 21/67069* (2013.01); *H01L 21/67109* (2013.01); *H01L 21/67248* (2013.01); *H01L 21/67288* (2013.01);

(Continued)

(58) Field of Classification Search
CPC ...... B23Q 3/15; G01K 2217/00; G01K 3/005; G01K 7/01; H01J 2237/2001; H01J 2237/3344; H01J 37/32642; H01J 37/32697; H01J 37/32715; H01J 37/32724; H01J 37/32908; H01L 21/67069; H01L 21/67109; H01L 21/67248; H01L 21/67288; H01L 21/6833; H01L 23/34; H01L 27/0266; H01L 27/0629; H01L 28/20; H01L 29/16; H01L 29/2003; H01L 29/778; H01L 29/78; H01L 29/808; H02H 1/0007; H02H 3/08; H02H 5/044; H02N 13/00; H03K 17/0822; H03K 17/18; H03K 2017/0806; H03K 2217/0027
See application file for complete search history.

(56) References Cited

U.S. PATENT DOCUMENTS 5,325,261 A    6/1994   Horwitz
5,548,470 A *   8/1996   Husain ................ H01L 21/6833
                                                    361/234

(Continued)

FOREIGN PATENT DOCUMENTS

KR    10-2003-0008724     1/2003

*Primary Examiner* — Jared Fureman
*Assistant Examiner* — Nicolas Bellido
(74) *Attorney, Agent, or Firm* — Lee IP Law, P.C.

(57) ABSTRACT

An electrostatic chuck assembly includes an electrostatic chuck including a circular-shaped electrostatic dielectric layer on which a wafer is mounted and an adsorption electrode in the electrostatic dielectric layer, and a control part configured to control the electrostatic chuck, wherein the adsorption electrode comprises a plurality of sub-adsorption electrodes separated from each other in an X direction and a Y direction perpendicular to the X direction on a plane level from a central portion of the electrostatic dielectric layer.

18 Claims, 23 Drawing Sheets

(52) U.S. Cl.
CPC ............ *H01J 2237/2001* (2013.01); *H01J 2237/3344* (2013.01)

(56) References Cited

U.S. PATENT DOCUMENTS

| | | | |
|---|---|---|---|
| 5,872,694 | A | 2/1999 | Hoinkis et al. |
| 6,483,690 | B1 | 11/2002 | Nakajima et al. |
| 6,522,519 | B1 | 2/2003 | Hirayanagi |
| 7,658,816 | B2 * | 2/2010 | Koshiishi .......... H01J 37/32642 156/345.43 |
| 7,957,118 | B2 | 6/2011 | Chang et al. |
| 8,408,262 | B2 * | 4/2013 | Guo .................... B32B 37/0007 156/358 |
| 8,441,772 | B2 * | 5/2013 | Yoshikawa ......... H01L 21/6833 361/234 |
| 9,190,308 | B2 | 11/2015 | Adachi |
| 9,218,998 | B2 * | 12/2015 | Chen .................. H01L 21/6831 |
| 2013/0171336 | A1 * | 7/2013 | Cheng ............... H01L 21/68785 427/9 |
| 2016/0035610 | A1 * | 2/2016 | Park ................. H01J 37/32715 156/345.29 |

* cited by examiner

ELECTROSTATIC CHUCK ASSEMBLY AND SEMICONDUCTOR MANUFACTURING APPARATUS INCLUDING THE SAME

CROSS-REFERENCE TO RELATED APPLICATION

Korean Patent Application No. 10-2016-0143422, filed on Oct. 31, 2016, in the Korean Intellectual Property Office, and entitled: "Electrostatic Chuck Assembly and Semiconductor Manufacturing Apparatus Including the Same," is incorporated by reference herein in its entirety.

BACKGROUND

1. Field

Embodiments relate to an electrostatic chuck assembly and a semiconductor manufacturing apparatus having the electrostatic chuck assembly, and more particularly, to an electrostatic chuck assembly for uniformly chucking (fixing) a wafer despite warpage of the wafer and a semiconductor manufacturing apparatus having the electrostatic chuck assembly.

2. Description of the Related Art

A wafer has to be fixed during wafer processing in a semiconductor manufacturing apparatus. The wafer is fixed using an electrostatic chuck via electrostatic force.

SUMMARY

According to an aspect of embodiments, there is provided an electrostatic chuck assembly including an electrostatic chuck having a circular-shaped electrostatic dielectric layer on which a wafer is mounted and an adsorption electrode in the electrostatic dielectric layer, and a control part configured to control the electrostatic chuck. The adsorption electrode includes a plurality of sub-adsorption electrodes separated from each other in an X direction and a Y direction perpendicular to the X direction on a plane level from a central portion of the electrostatic dielectric layer.

According to another aspect of embodiments, there is provided an electrostatic chuck assembly including an electrostatic chuck having a base, an electrostatic dielectric layer on the base, and an adsorption electrode in the electrostatic dielectric layer to adsorb a wafer mounted on the electrostatic dielectric layer, and a control part configured to control the electrostatic chuck. The adsorption electrode includes a plurality of sub-adsorption electrodes separated from each other in an X direction and a Y direction perpendicular to the X direction on a plane level from a central portion of the electrostatic dielectric layer. A top surface of the electrostatic dielectric layer includes at least one protrusion that contacts the wafer, and at least one recess portion that does not contact the wafer. A gas channel is connected to the at least one recess portion to provide a thermally conductive gas through the electrostatic chuck to control a temperature of the wafer.

According to yet another aspect of embodiments, there is provided an semiconductor manufacturing apparatus including a vacuum chamber having a processing chamber in which wafer processing is performed, an electrostatic chuck configured to adsorb a wafer in the processing chamber, a control part configured to control the electrostatic chuck, and a plasma generating unit configured to generate plasma in the processing chamber to perform the wafer processing. The electrostatic chuck includes a circular-shaped electrostatic dielectric layer on which the wafer is mounted and an adsorption electrode in the electrostatic dielectric layer. The adsorption electrode includes a plurality of sub-adsorption electrodes separated from each other in an X direction and a Y direction perpendicular to the X direction on a plane level from a central portion of the electrostatic dielectric layer.

According to still another aspect of embodiments, there is provided an electrostatic chuck including an electrostatic chuck having an electrostatic dielectric layer on a base, the electrostatic dielectric layer to support a wafer, and an adsorption electrode within the electrostatic dielectric layer, the adsorption electrode including a plurality of sub-adsorption electrodes separated from each other in an X direction and a Y direction perpendicular to the X direction, and bottom surfaces of all the sub-adsorption electrodes being substantially level with each other and parallel to a bottom surface of the electrostatic dielectric layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
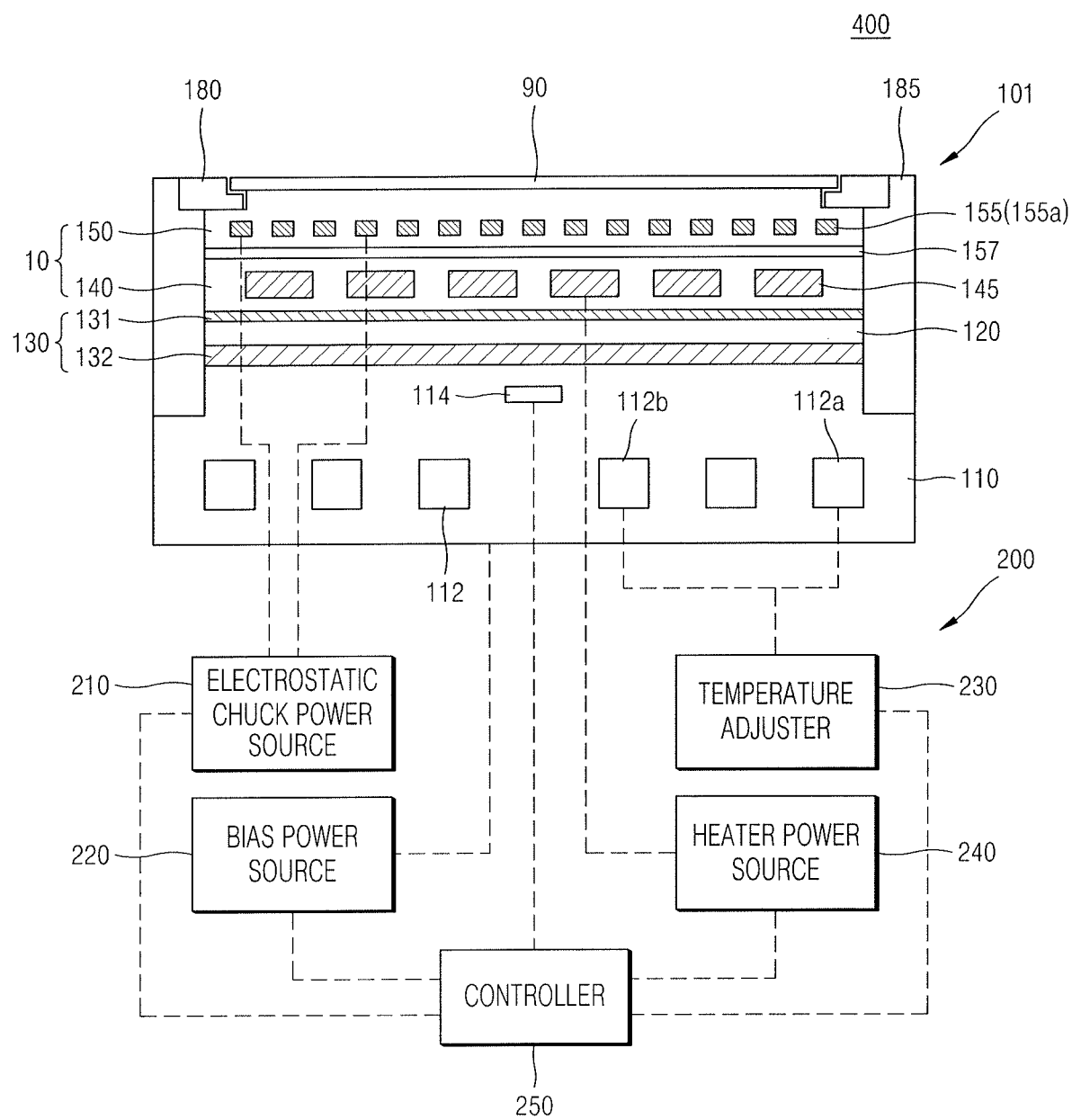
FIG. 1 illustrates a cross-sectional view of an electrostatic chuck assembly according to an embodiment.

Hereinafter, embodiments will be described in detail with reference to the accompanying drawings. Like reference numerals in the drawings denote like elements. The embodiments below may be configured independently of each other or may be combined with each other.

FIG. 1 is a cross-sectional view of an electrostatic chuck assembly 400 according to an embodiment.

Referring to FIG. 1, the electrostatic chuck assembly 400 may include an electrostatic chuck 101 for adsorbing a wafer 90 thereon, e.g., a silicon wafer, and a control part 200 for controlling the operation of the electrostatic chuck 101. The electrostatic chuck 101 may include a base 110 and a dielectric stack 10 bonded to the base 110 by an adhesive layer 130.

The dielectric stack 10 may include a heater dielectric layer 140 and an electrostatic dielectric layer 150, sequentially stacked on the base 110. The adhesive layer 130 may be between the heater dielectric layer 140 and the base 110, and may have a double-layer structure including a first adhesive 131 and a second adhesive 132. A metal plate 120 may further be provided between the first adhesive 131 and the second adhesive 132.

The base 110 may have a circular or disk shape and include a metal, e.g., aluminum (Al) titanium (Ti), stainless steel, or tungsten (W) or an alloy thereof. The base 110 may include a cooling channel 112 and a temperature sensor 114.

For example, the electrostatic chuck 101 may be used in a plasma processing apparatus that processes the wafer 90 by using plasma. In this case, the inside of a chamber, where the electrostatic chuck 101 is installed, may be a high-temperature environment, and when the wafer 90 is exposed to high-temperature plasma, damage to the wafer 90, e.g., ion bombardment, may occur. Therefore, the wafer 90 may require cooling, prior to the plasma treatment, to avoid damage to the wafer 90 and to perform a uniform plasma treatment.

Therefore, in order to cool the wafer 90, the base 110 may be provided with the cooling channel 112 through which a cooling fluid flows. For example, the cooling fluid may include water, ethylene glycol, silicone oil, liquid Teflon®, or a mixture of water and glycol. The cooling channel 112 may have a concentric or helical pipe structure about the central axis of the base 110, e.g., the cooling channel 112 may be a continuous pipe along a perimeter of the base 110 that continues to extend and circle within the base to define multiple concentric circles with decreasing dimeters (e.g., three concentric circles in FIG. 1). However, embodiments are not limited thereto.

The cooling channel 112 may include an inlet 112a, i.e., through which the cooling fluid flows in, and an outlet 112b, i.e., through which the cooling fluid flows out. The inlet 112a and the outlet 112b may be connected to a temperature adjuster 230 of the control part 200. The flow rate and temperature of the cooling fluid circulating in the cooling channel 112 may be adjusted by the temperature adjuster 230.

The base 110 may be electrically connected to a bias power source 220 of the control part 200. A high frequency or radio frequency signal may be applied from the bias power source 220 to the base 110, and thus, the base 110 may serve as an electrode for plasma generation.

The base 110 may further include the temperature sensor 114. The temperature sensor 114 may transmit a measured temperature of the base 110 to a controller 250 of the control part 200. The temperature of the electrostatic chuck 101, e.g., the temperature of the electrostatic dielectric layer 150 or of the wafer 90, may be predicted based on a temperature measured by the temperature sensor 114, and may be adjusted by the cooling channel 112 and the temperature adjuster 230.

The heater dielectric layer 140 may include an embedded heater electrode 145 to further adjust temperature. The heater dielectric layer 140 may include a dielectric such as a ceramic material, e.g., aluminum oxide ($Al_2O_3$), aluminum nitride (AlN), or yttrium oxide ($Y_2O_3$), or a resin, e.g., polyimide. The heater dielectric layer 140 may be in the form of a circle or a disk, e.g., have a same shape and completely overlap the top of the base 110.

The heater electrode 145 may include a conductor within the heater dielectric layer 140. For example, the heater electrode 145 may include a metal, e.g., tungsten (W), copper (Cu), nickel (Ni), molybdenum (Mo), titanium (Ti), nickel (Ni)-chromium (Cr) alloy, or nickel (Ni)-aluminum (Al) alloy, or a conductive ceramic material, e.g., tungsten carbide (WC), molybdenum carbide (MoC), or titanium nitride (TiN).

The heater electrode 145 may be electrically connected to a heater power source 240 of the control part 200. The heater electrode 145 may be heated by power, e.g., an AC voltage, from the heater power source 240, and thus, the temperature of the electrostatic chuck 101 or the wafer 90 may be adjusted. The heater electrode 145 may have a concentric or spiral pattern with respect to the central axis of the heater dielectric layer 140, e.g., the portions of the heater electrode 145 in FIG. 1 are cross sections of concentric patterns. However, embodiments are not limited thereto.

The electrostatic dielectric layer 150 may include an embedded adsorption electrode 155, e.g., the adsorption electrode 155 may be spaced apart from top and bottom surface of the electrostatic dielectric layer 150. The adsorption electrode 155 may be referred to as a clamp electrode. The electrostatic dielectric layer 150 may include a dielectric such as a ceramic material, e.g., $Al_2O_3$, AlN, or $Y_2O_3$, or a resin material, e.g., polyimide. The electrostatic dielectric layer 150 may be in the form of a circle or a disk, e.g., have a same shape and completely overlap the top of the heater dielectric layer 140.

The wafer 90 may be placed on the electrostatic dielectric layer 150. The adsorption electrode 155 may include a conductor. For example, the adsorption electrode 155 may include a metal, e.g., W, Cu, Ni, Mo, Ti, Ni—Cr alloy, or Ni—Al alloy, or a conductive ceramic material, e.g., WC, MoC, or TiN.

The adsorption electrode 155 may be electrically connected to an electrostatic chuck power source 210 of the control part 200. An electrostatic force may be generated between the adsorption electrode 155 and the wafer 90 by power, e.g., a DC voltage, applied from the electrostatic chuck power source 210, and thus, the wafer 90 may be adsorbed onto the electrostatic dielectric layer 150. The structure of the adsorption electrode 155 will be described in detail later.

The dielectric stack 10 may optionally further include a heat distribution layer 157 provided between the heater dielectric layer 140 and the electrostatic dielectric layer 150. The heat distribution layer 157 may include, e.g., an aluminum nitride (AlN) layer, a boron nitride (BN) layer, a tungsten (W) layer, a molybdenum (Mo) layer, or the like, which has thermal conductivity of about 10 W/mK or more. The heat distribution layer 157 may more evenly distribute heat generated by the heater electrode 145.

The adsorption electrode 155 and the heater electrode 145 must not be electrically short-circuited. The electrical resistance between the adsorption electrode 155 and the heater electrode 145 may be about 1 kΩ or more. In other words, the electrostatic dielectric layer 150, the heater dielectric layer 140, and the heat distribution layer 157 may include a material that allows the electrical resistance between the adsorption electrode 155 and the heater electrode 145 to be at least about 1 kΩ.

The electrostatic chuck power source 210, the bias power source 220, the heater power source 240, and the temperature adjuster 230 may be controlled by the controller 250. The controller 250 may read the temperatures of the electrostatic chuck 101 and the wafer 90 based on a temperature measured by the temperature sensor 114, and may adjust the power of the heater power source 240 to adjust the amount of heat generated by the heater electrode 145 or control the temperature adjuster 230 to adjust flow rate and temperature of the cooling fluid circulating in the cooling channel 112. Thus, the temperatures of the electrostatic chuck 101 and the wafer 90 may be appropriately controlled.

The electrostatic chuck 101 may include a focus ring 180 that extends along the circumference of the wafer 90 and surrounds the wafer 90 in an annular shape. The focus ring 180 may be provided to improve wafer processing, e.g., plasma etching uniformity. The focus ring 180 may include a material having a dielectric constant of 3 or less or specific resistance of 100 Ωcm or less. For example, the focus ring 180 may include quartz, $Al_2O_3$, $Y_2O_3$, silicon (Si), silicon carbide (SiC), carbon (C), silicon oxide ($SiO_2$), and/or the like.

An outer ring 185 for shielding the outer wall of the electrostatic chuck 101 may further be provided. The outer ring 185 may include a material that is substantially the same as the focus ring 180.

The electrostatic chuck 101 may have a stepped structure suitable for applying a uniform electric field to the wafer 90. The electrostatic dielectric layer 150 may be bonded to the heater dielectric layer 140 without the aid of an adhesive layer. The heater dielectric layer 140 may be bonded to the base 110 by the adhesive layer 130 having a double-layer structure. The outer ring 185 may extend along an upper portion of the electrostatic chuck 101 and along outer sidewalls of the adhesive layer 130, the dielectric stack 10, and the focus ring 180.

Figure 2:
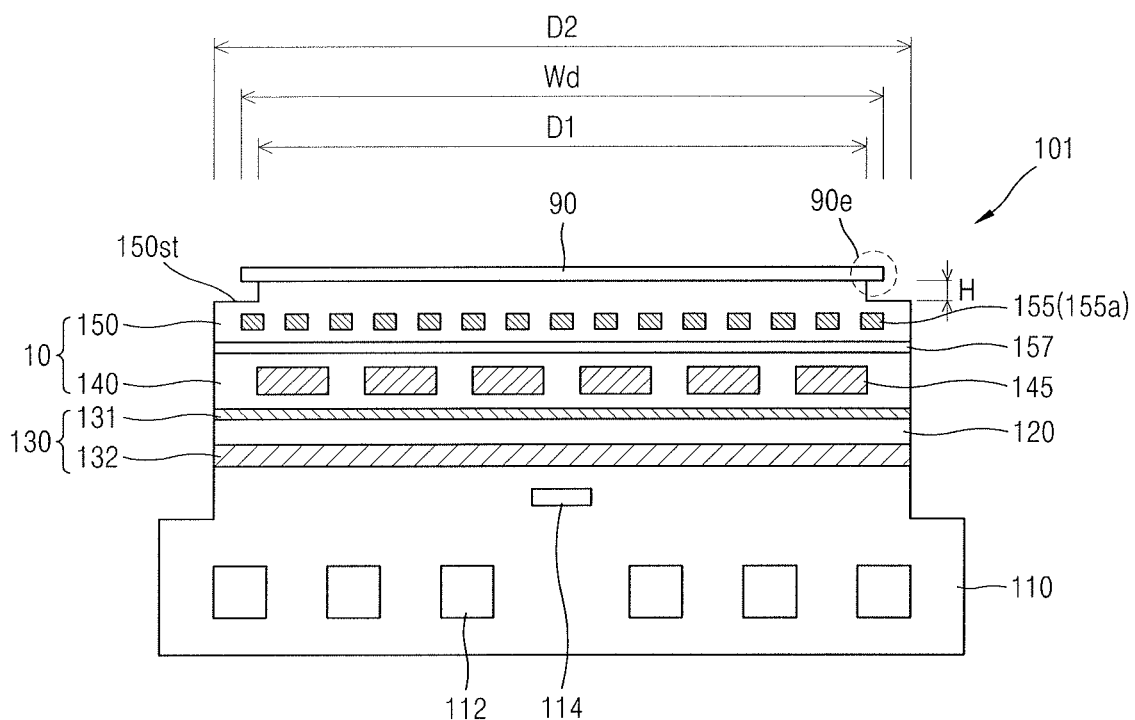
FIG. 2 illustrates a cross-sectional view of a part of the electrostatic chuck assembly of FIG. 1.
Figure 3:
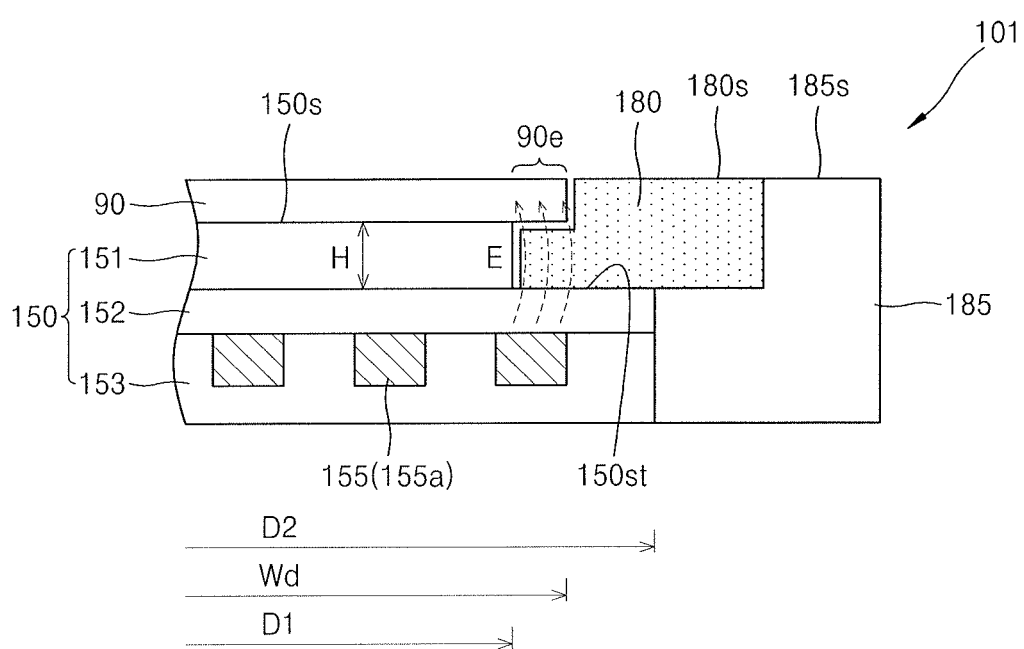
FIG. 3 illustrates an enlarged cross-sectional view of a part of FIG. 2.
Figure 4:
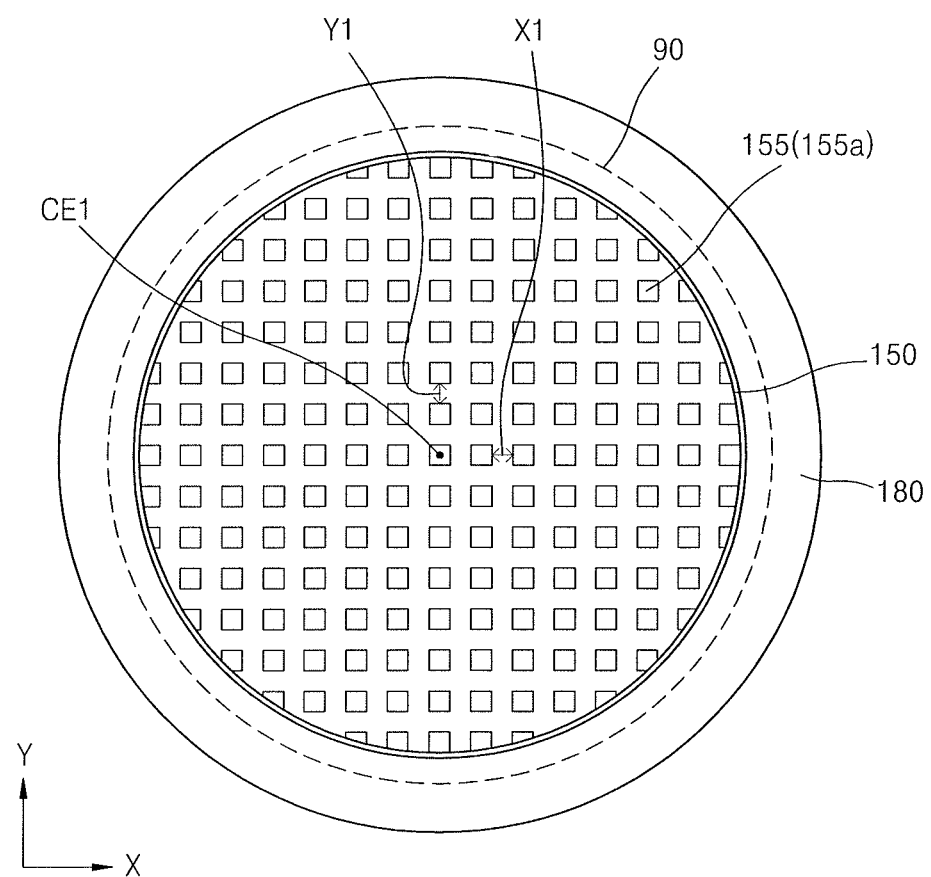
FIG. 4 illustrates a plan view of a wafer mounted on an electrostatic dielectric layer of the electrostatic chuck of FIG. 1.

FIG. 2 is a detailed cross-sectional view of the electrostatic chuck 101, FIG. 3 is an enlarged cross-sectional view of a part of FIG. 2, and FIG. 4 is a plan view of the wafer 90 on the electrostatic dielectric layer 150 of the electrostatic chuck 101. It is noted that the focus ring 180 is not illustrated in FIG. 2 only to better illustrate the structure of the stepped pattern of the electrostatic dielectric layer 150.

Refining to FIGS. 2 and 3, the electrostatic dielectric layer 150 may have a stepped pattern 150st. For example, the electrostatic dielectric layer 150 may have a stepped pattern 150st formed by recessing the top of its sidewall toward the center of the electrostatic dielectric layer 150.

As shown in FIGS. 2-3, the electrostatic dielectric layer 150 may include an upper layer portion 151 having the step pattern 150st, on which the wafer 90 is mounted, an intermediate portion 152 protruding further than the upper layer portion 151 in a lateral direction, and a lower layer portion 153 placed under the intermediate portion 152 and protruding further than the upper layer portion 151 in the lateral direction, e.g., the intermediate and lower layer portions 152 and 153 may be laterally aligned. The lower layer portion 153 may have the adsorption electrode 155 arranged therein.

In the present specification, the electrostatic dielectric layer 150 mainly refers to the upper layer portion 151 and the intermediate portion 152 by which an electrostatic force acts on the wafer 90. The upper layer portion 151 of the electrostatic dielectric layer 150 may have a smaller size, e.g., diameter, than the wafer 90, and the intermediate portion 152 and the lower layer portion 153 of the electrostatic dielectric layer 150 may have larger sizes, e.g., diameters, than the upper layer portion 151. The intermediate portion 152 and the lower layer portion 153 of the electrostatic dielectric layer 150 may have the same size as the wafer 90 or larger. The "size" may mean diameter.

For example, when the electrostatic dielectric layer 150 has a circular shape or a disk shape, the upper layer portion 151 may have a first diameter D1, and the intermediate portion 152 and the lower layer portion 153 may have a second diameter D2 that is greater than the first diameter D1. The wafer 90 may have a diameter Wd that is greater than the first diameter D1. In other words, the wafer 90 may have a larger size (diameter) than the upper layer portion 151 and an edge 90e of the wafer 90 may protrude beyond the side of the upper layer portion 151 when the wafer 90 is mounted on the electrostatic dielectric layer 150.

Since the upper layer portion 151 is covered by the wafer 90, the upper layer portion 151 may be free from damage that may be caused, e.g., by plasma processing. The second diameter D2 of the intermediate portion 152 and the lower layer portion 153 may be greater than the diameter Wd of the wafer 90. When the diameter Wd of the wafer 90 is about 300 mm, the first diameter D1 of the upper layer portion 151 may be about 296 mm to about 299 mm, and the second diameter D2 of the intermediate portion 152 and the lower layer portion 153 may be about 297 mm to about 340 mm.

The heater dielectric layer 140 may be in the form of a disk having a diameter that is substantially the same as the second diameter D2 of the intermediate portion 152 and the lower layer portion 153. An upper part of the base 110 adjacent to the dielectric stack 10 may have a diameter that is substantially the same as the second diameter D2 of the intermediate portion 152 and the lower layer portion 153. The height of the upper layer portion 151, i.e., the height H of the step pattern 150st, may be about 0.5 mm to 4 mm.

For example, the wafer 90 may be mounted on a flat surface 150s of the electrostatic dielectric layer 150, as shown in FIG. 3. A surface 180s of the focus ring 180 and/or a surface 185s of the outer ring 185 may be planar with a surface roughness Ra of about 0.8 μm or less. In another example, the surface 150s of the electrostatic dielectric layer 150 may be non-planar.

When DC power is applied to the adsorption electrode 155, the wafer 90 may be adsorbed onto the electrostatic dielectric layer 150 by an electrostatic force. The electrostatic dielectric layer 150 may have the step pattern 150st so that the intermediate portion 152 and the lower layer portion 153 protrude farther than, e.g., beyond, the upper layer portion 151. The adsorption electrode 155 in the lower layer portion 153 may protrude farther than, e.g., beyond, the side of the upper layer 151, and the edge of the adsorption electrode 155 may be below the edge 90e of the wafer 90, e.g., edges of the adsorption electrode 155 and the wafer 90 may be aligned to have respective lateral side aligned. As the edge of the adsorption electrode 155 substantially overlaps the edge 90e of the wafer 90, an electric field E may be easily applied to the edge 90e of the wafer 90.

In an embodiment, an electric field E having an intensity that is substantially the same as the intensity of an electric field applied to the center of the wafer 90 or a portion adjacent to the center may be applied to the edge 90e of the wafer 90. As the electric field E having uniform intensity is applied to the wafer 90, wafer processing may be performed with uniform plasma density as well as uniform adsorption force.

An electrostatic force may be generated when a DC voltage is applied to the adsorption electrode 155. As shown in FIG. 4, the adsorption electrode 155 may include a plurality of sub-adsorption electrodes 155a separated from each other in the X direction and the Y direction perpendicular to the X direction on a plane level from a central portion CE1 of the electrostatic dielectric layer 150, e.g., the plurality of sub-adsorption electrodes 155a may be arranged in a same plane to have their bottom surfaces substantially level with each other and their top surfaces substantially level with each other. For example, as illustrated in FIG. 4, the plurality of sub-adsorption electrodes 155a may be arranged in a matrix pattern within the electrostatic dielectric layer 150.

The arrangement of the sub-adsorption electrodes 155a in the X direction and the Y direction may be variously configured. For example, the sub-adsorption electrodes 155a may be arranged at equal separation distances (e.g., X1) in the X direction. The sub-adsorption electrodes 155a may be arranged at equal separation distances (e.g., Y1) in the Y direction.

When the arrangement of the sub-adsorption electrodes 155a is variously configured, the wafer 90 may be uniformly adsorbed onto the electrostatic dielectric layer 150 by an electrostatic force by applying electrostatic voltages having various magnitudes to the sub-adsorption electrodes 155a even if warpage of the wafer 90 occurs unevenly, e.g., asymmetrically.

In other words, when the arrangement of the sub-adsorption electrodes 155a is variously configured, the wafer 90 may be uniformly adsorbed onto the electrostatic dielectric layer 150 by applying electrostatic voltages having various magnitudes to the sub-adsorption electrodes 155a even if warpage of the wafer 90 occurs asymmetrically, e.g., occurs asymmetrically like a horse saddle. The electrostatic voltage may be referred to as a chucking voltage. The X-direction and Y-direction arrangement of the sub-adsorption electrodes 155a will be described in more detail later.

The focus ring 180 may be between the edge 90e of the wafer 90 and the intermediate portion 152 of the wafer 90. The intensity of the electric field E applied to the edge 90e of the wafer 90 may vary depending on the dielectric constant of the focus ring 180. For example, as the dielectric constant of the focus ring 180 increases, the strength of the electric field E may increase.

Figure 5A:
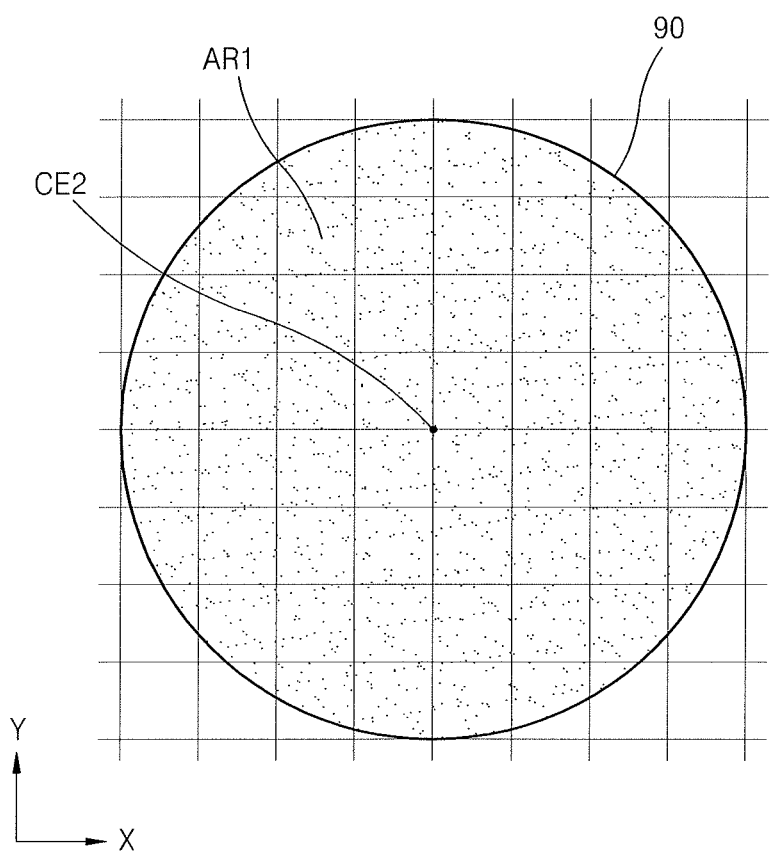
FIG. 5A illustrates a plan view of divided regions of a wafer applied to an electrostatic chuck assembly according to an embodiment.
Figure 5B:
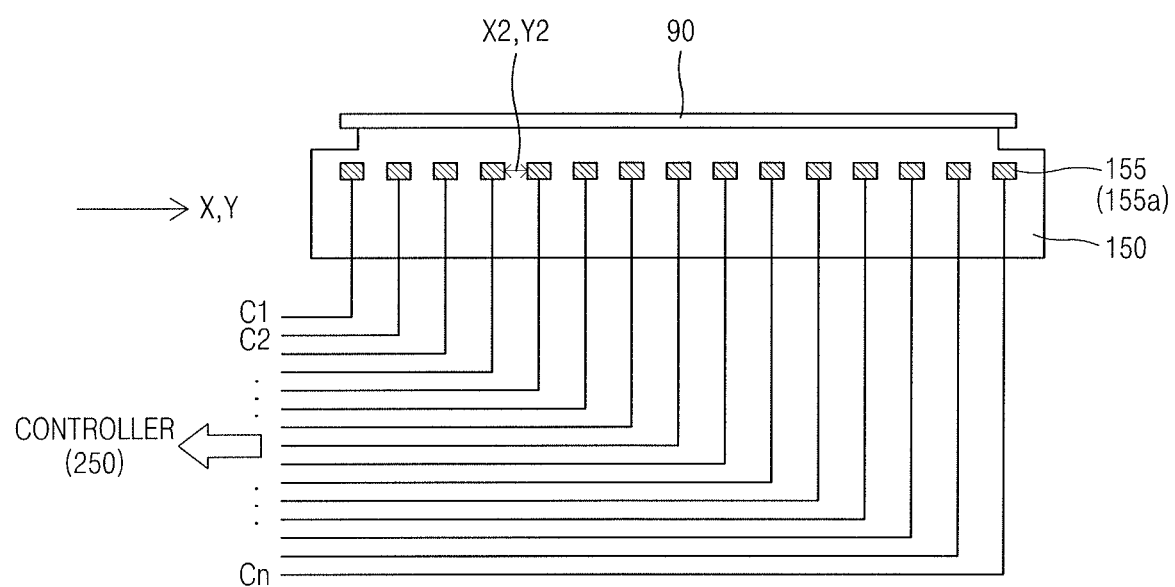
FIG. 5B illustrates a cross-sectional view of sub-adsorption electrodes of an electrostatic chuck assembly according to an embodiment.

FIG. 5A is a plan view showing divided regions of a wafer 90 applied to an electrostatic chuck assembly according to an embodiment, and FIG. 5B is a cross-sectional view of sub-adsorption electrodes of an electrostatic chuck assembly according to an embodiment.

In detail, as shown in FIG. 5A, the wafer 90 mounted on the electrostatic dielectric layer 150 in FIGS. 1 to 4 may include a plurality of divided regions AR1 defined to have the same area in the X direction and the Y direction perpendicular to the X direction on a plane level from a central portion CE2. The size, e.g., the area, of the divided regions AR1 may be variously changed according to the shape of the warpage of the wafer 90, and FIG. 5A is presented as an embodiment.

As shown in FIG. 5B, the wafer 90 may be mounted on the electrostatic dielectric layer 150. The central portion CE2 of the wafer 90 may vertically coincide, e.g., align, with the central portion CE1 of the electrostatic dielectric layer 150 shown in FIG. 4. Sub-adsorption electrodes 155a may be arranged in the electrostatic dielectric layer 150. As shown in FIG. 5A, the sub-adsorption electrodes 155a may be arranged at equal separation distances, e.g., X2 and Y2, in the X direction and the Y direction. The separation distances X2 and Y2 in the X direction and the Y direction of the sub-adsorption electrodes 155a shown in FIG. 5B may be the same as the separation distances X1 and Y1 in FIG. 4, respectively.

The sub-adsorption electrodes 155a may be connected to the controller 250 via electrical wiring lines C1 to Cn, where n is an integer. A positive voltage and a negative voltage may be selectively applied to the electrical wiring lines C1 to Cn by using the controller 250. For example, by using the controller 250, a positive voltage may be applied to the electric wiring lines C1, C3, C5, . . . and a negative voltage may be applied to the electric wiring lines C2, C4, C6, . . . . In addition, an electrostatic force that is applied to the wafer 90 may be adjusted by varying the magnitudes of voltages that are applied to the electrical wiring lines C1 to Cn by using the controller 250.

As described above, when the wafer 90 includes the plurality of divided regions AR1 having the same area, and the sub-adsorption electrodes 155a are arranged at equal separation distances X2 and Y2 in the X and Y directions to correspond to the divided regions AR1, the wafer 90 may be uniformly adsorbed onto the electrostatic dielectric layer 150 by adjusting, e.g., independently, the electrostatic force for each of the divided regions AR1 of the wafer 90 in consideration of warpage occurring unevenly, e.g., asymmetrically, in the wafer 90.

Figure 6A:
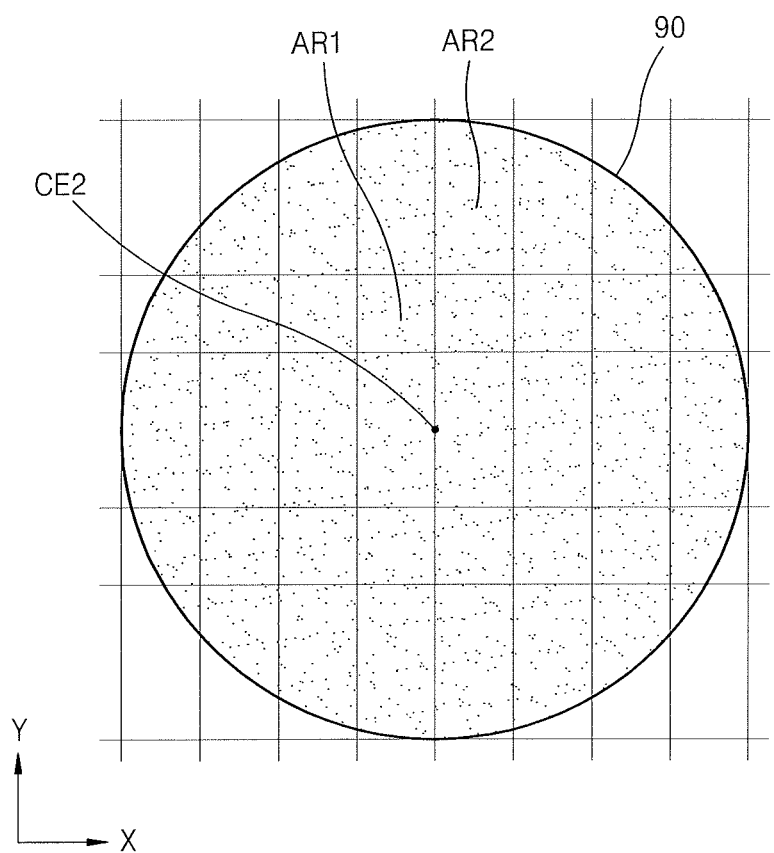
FIG. 6A illustrates a plan view of divided regions of a wafer applied to an electrostatic chuck assembly according to an embodiment.
Figure 6B:
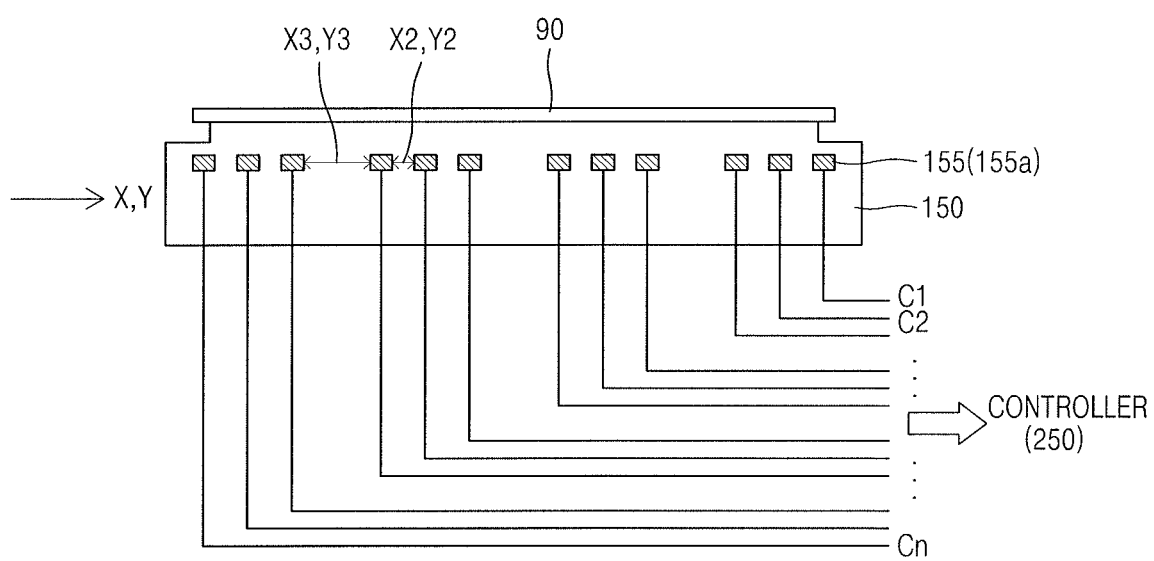
FIG. 6B illustrates a cross-sectional view of sub-adsorption electrodes of an electrostatic chuck assembly according to an embodiment.

FIG. 6A is a plan view of divided regions of the wafer 90 applied to an electrostatic chuck assembly according to an embodiment, and FIG. 6B is a cross-sectional view of sub-adsorption electrodes of an electrostatic chuck assembly according to an embodiment.

In detail, as shown in FIG. 6A, the wafer 90 mounted on the electrostatic dielectric layer 150 in FIG. 1 to FIG. 4 may include a plurality of divided regions AR1 and AR2 defined to have different areas in the X direction and the Y direction perpendicular to the X direction on a plane level from a central portion CE2.

The sizes, e.g., the areas of the divided regions AR1 and AR2, may be variously changed according to the shape of the warpage of the wafer 90, and FIG. 6A is presented as an embodiment. The area of the divided region AR2 may be greater than the area of the divided region AR1. The division of the wafer 90 may be variously changed according to the shape of the warpage of the wafer 90, and FIG. 6A is shown as an embodiment.

The wafer 90 may be mounted on the electrostatic dielectric layer 150, as shown in FIG. 6B. Sub-adsorption electrodes 155a may be arranged in the electrostatic dielectric layer 150. As shown in FIG. 6B, the sub-adsorption electrodes 155a may be arranged at different separation distances, e.g., X2, Y2, X3 and Y3, in the X direction and the Y direction.

The separation distances X2 and Y2 in the X direction and the Y direction of the sub-adsorption electrodes 155a shown in FIG. 6B may be the same as the separation distances X1 and Y1 in FIG. 4, respectively. The separation distances X3 and Y3 in the X direction and the Y direction of the sub-adsorption electrodes 155a shown in FIG. 6B may be greater than the separation distances X1 and Y1 in FIG. 4, respectively.

The sub-adsorption electrodes 155a may be connected to the controller 250 via electrical wiring lines C1 to Cn, where n is an integer. A positive voltage and a negative voltage may be selectively applied to the electrical wiring lines C1 to Cn by using the controller 250. For example, by using the controller 250, a positive voltage may be applied to the electric wiring lines C1, C3, C5, . . . and a negative voltage may be applied to the electric wiring lines C2, C4, C6, . . . . In addition, an electrostatic force that is applied to the wafer 90 may be adjusted by varying the magnitudes of voltages that are applied to the electrical wiring lines C1 to Cn by using the controller 250.

As described above, when the wafer 90 includes the plurality of divided regions AR1 and AR2 having different areas and the sub-adsorption electrodes 155a are arranged at the different separation distances X2, Y2, X3 and Y3 in the X and Y directions to correspond the divided regions AR1 and AR2, the wafer 90 may be uniformly adsorbed onto the electrostatic dielectric layer 150 by adjusting the electrostatic force for each of the divided regions AR1 and AR2 of the wafer 90 in consideration of warpage occurring unevenly in the wafer 90.

Figure 7:
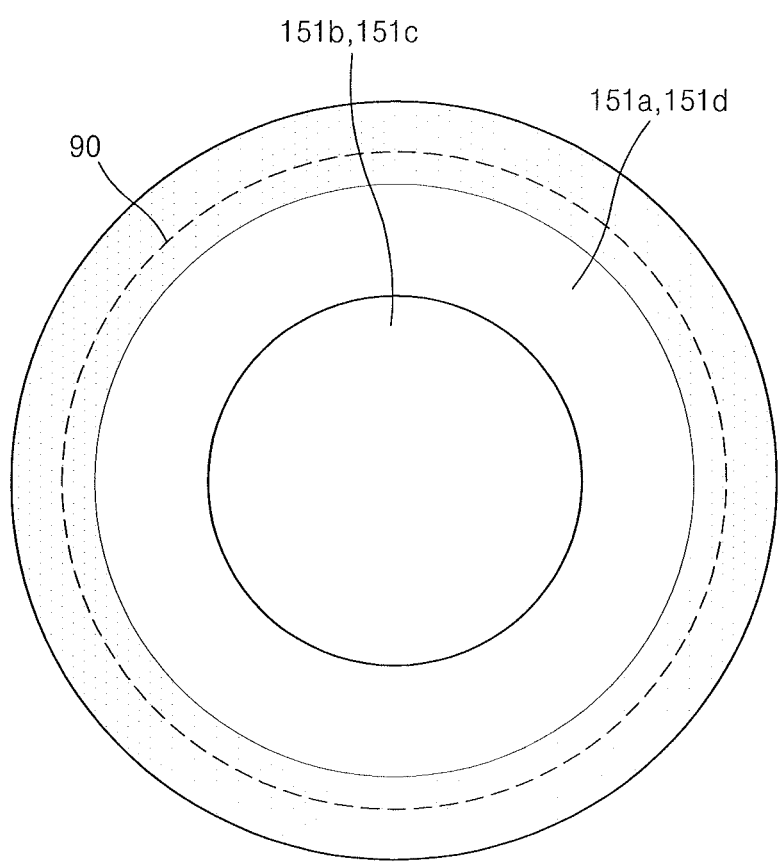
FIG. 7 illustrates a plan view of a wafer mounted on an electrostatic dielectric layer of an electrostatic chuck assembly according to an embodiment.
Figure 8A:
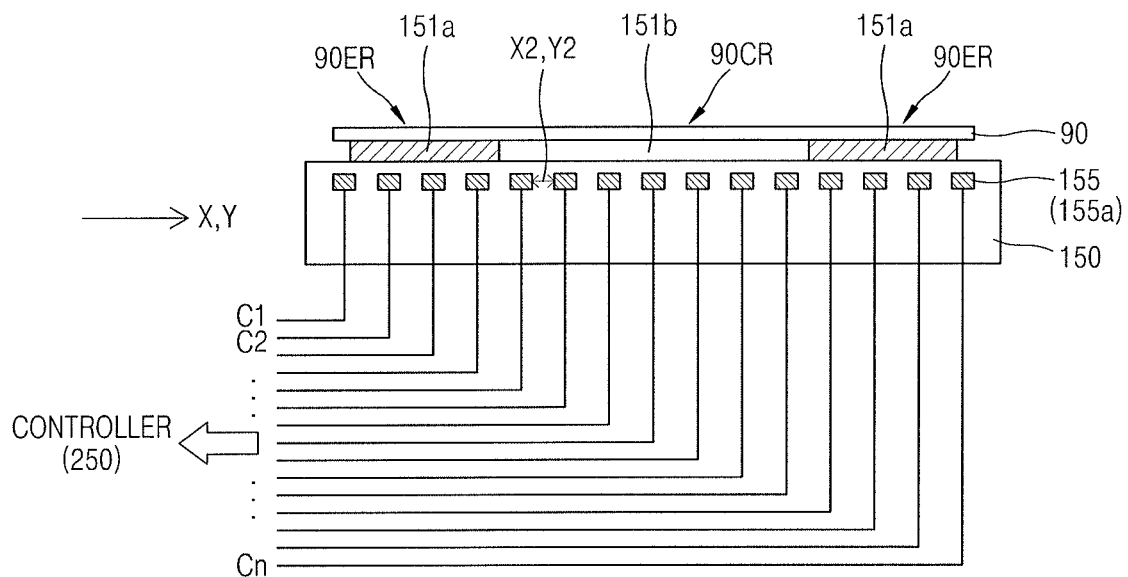
FIGS. 8A and 8B illustrate cross-sectional views of a wafer mounted on an electrostatic dielectric layer of an electrostatic chuck assembly according to an embodiment.
Figure 8B:
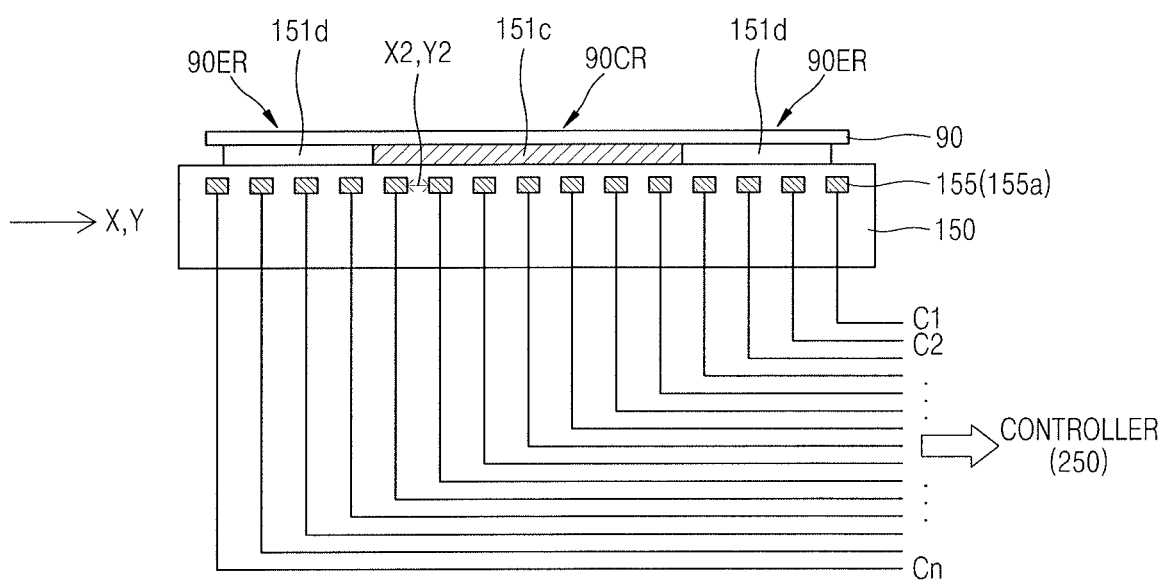

FIG. 7 is a plan view of the wafer 90 mounted on the electrostatic dielectric layer 150 of an electrostatic chuck assembly according to an embodiment. FIGS. 8A and 8B are cross-sectional views of the wafer 90 on the electrostatic dielectric layer 150 of an electrostatic chuck assembly according to an embodiment.

In detail, the electrostatic dielectric layer 150, e.g., the upper layer portion 151 of the electrostatic dielectric layer 150, may include an inner region 151b or 151c corresponding to a central region 90CR of the wafer 90 mounted on the electrostatic dielectric layer 150, and an outer region 151a or 151d corresponding to an edge region 90ER surrounding the central region 90CR of the wafer 90. The inner regions 151b and 151c of the electrostatic dielectric layer 150 may respectively include materials having dielectric constants different from those of the outer regions 151a and 151d of the electrostatic dielectric layer 150.

For example, in FIG. 8A, the inner region 151b of the electrostatic dielectric layer 150 may include a material having a dielectric constant greater than that of the outer region 151a of the electrostatic dielectric layer 150. In FIG. 8B, the inner region 151c of the electrostatic dielectric layer 150 may include a material having a dielectric constant less than that of the outer region 151d of the electrostatic dielectric layer 150. The sizes of the dielectric constants of the inner and outer regions 151c and 151d in the electrostatic dielectric layer 150 may be variously changed according to the shape of warpage of the wafer 90, and FIGS. 8A and 8B are shown as embodiments.

As shown in FIGS. 8A and 8B, the wafer 90 may be mounted on the electrostatic dielectric layer 150 having different dielectric constants for the inner region 151b (or the inner region 151c) and the outer region 151a (or the outer region 151d). Sub-adsorption electrodes 155a may be arranged in the electrostatic dielectric layer 150. The sub-adsorption electrodes 155a may be arranged at equal separation distances, e.g., X2 and Y2, in the X direction and the Y direction.

The sub-adsorption electrodes 155a may be connected to the controller 250 via electrical wiring lines C1 to Cn, where n is an integer. Since the dielectric constant of the electrostatic dielectric layer 150 is different between the inner region 151b (or the inner region 151c) and the outer region 151a (or the outer region 151d), even if the levels of voltages that are applied to the electrical wiring lines C1 to Cn are the same by using the controller 250, an electrostatic force between the inner region 151b (or the inner region 151c) and the outer region 151a (or the outer region 151d) may be adjusted. For example, when the dielectric constant of the inner region 151b (or the inner region 151c) is greater than that of the outer region 151a (or the outer region 151d), the electrostatic force may increase. As the dielectric constant of the inner region 151b (or the inner region 151c) of the electrostatic dielectric layer 150 corresponding to the central region 90CR of the wafer 90 is different from the dielectric constant of the outer region 151a (or the outer region 151d) of the electrostatic dielectric layer 150 corresponding to the edge region 90ER of the wafer 90, the wafer 90 may be uniformly adsorbed onto the electrostatic dielectric layer 150.

Figure 9A:
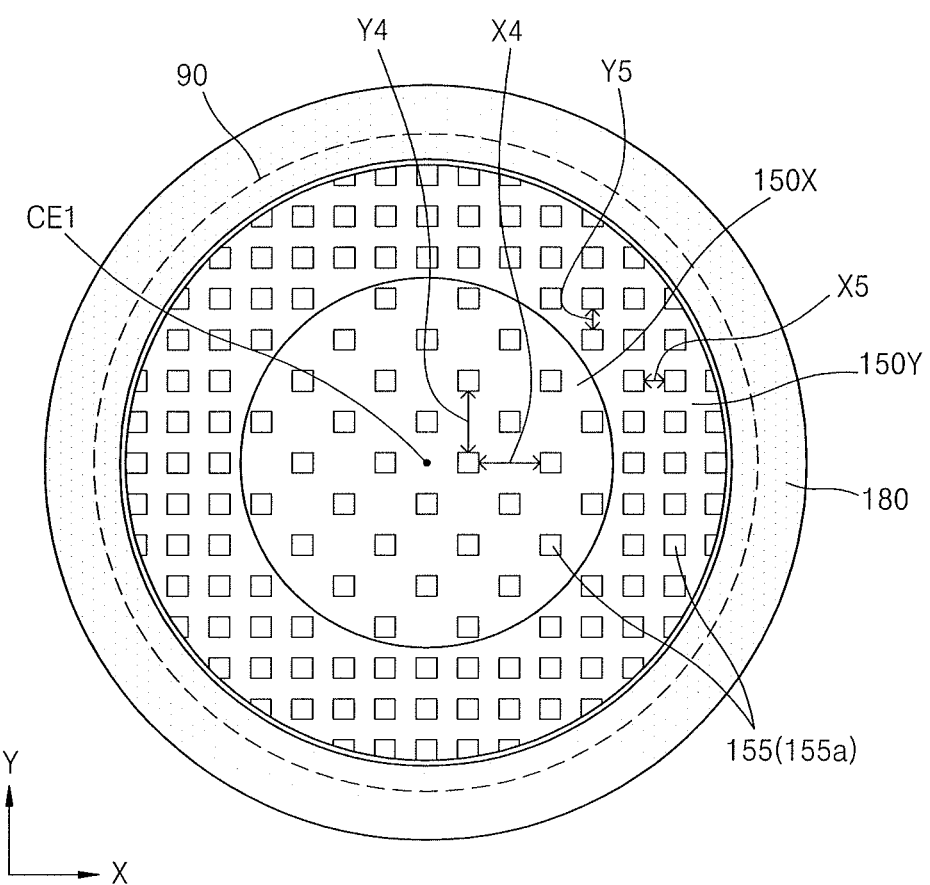
FIGS. 9A and 9B illustrate plan views of a wafer mounted on an electrostatic dielectric layer of an electrostatic chuck assembly according to an embodiment.
Figure 9B:
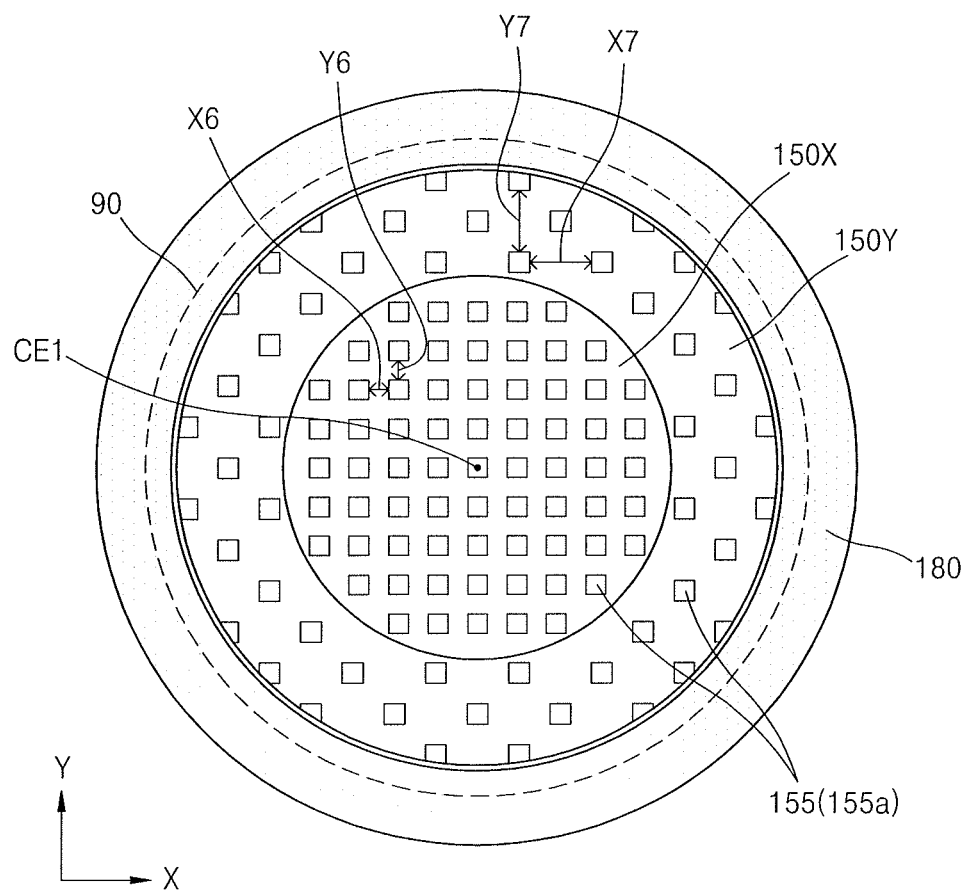

FIGS. 9A and 9B are cross-sectional views of the wafer 90 mounted on the electrostatic dielectric layer 150 of an electrostatic chuck assembly according to an embodiment.

In detail, the electrostatic dielectric layer 150 may include an inner region 150X corresponding to the central region 90CR (see FIGS. 8A and 8B) of the wafer 90 mounted on the electrostatic dielectric layer 150, and an outer region 150Y corresponding to the edge region 90ER (see FIGS. 8A and 8B) surrounding the central region 90CR of the wafer 90. As shown in FIGS. 9A and 9B, the adsorption electrode 155 may include the plurality of sub-adsorption electrodes 155a separated from each other in the X direction and the Y direction perpendicular to the X direction on a plane level from the central portion CE1 of the electrostatic dielectric layer 150.

In FIG. 9A, separation distances X4 and Y4 in the inner region 150X of the electrostatic dielectric layer 150 may be greater than separation distances X5 and Y5 in the outer region 150Y of the electrostatic dielectric layer 150. In FIG. 9B, separation distances X6 and Y6 in the inner region 150X of the electrostatic dielectric layer 150 may be less than separation distances X7 and Y7 in the outer region 150Y of the electrostatic dielectric layer 150. In this manner, the arrangement of the sub-adsorption electrodes 155a in the X direction and the Y direction may be variously configured. When the arrangement of the sub-adsorption electrodes 155a is variously configured for the inner region 150X and the outer region 150Y of the electrostatic dielectric layer 150 as described above, the wafer 90 may be uniformly adsorbed onto the electrostatic dielectric layer 150 by an electrostatic force by applying electrostatic voltages having various magnitudes to the sub-adsorption electrodes 155a even if warpage of the wafer 90 occurs unevenly.

Figure 10:
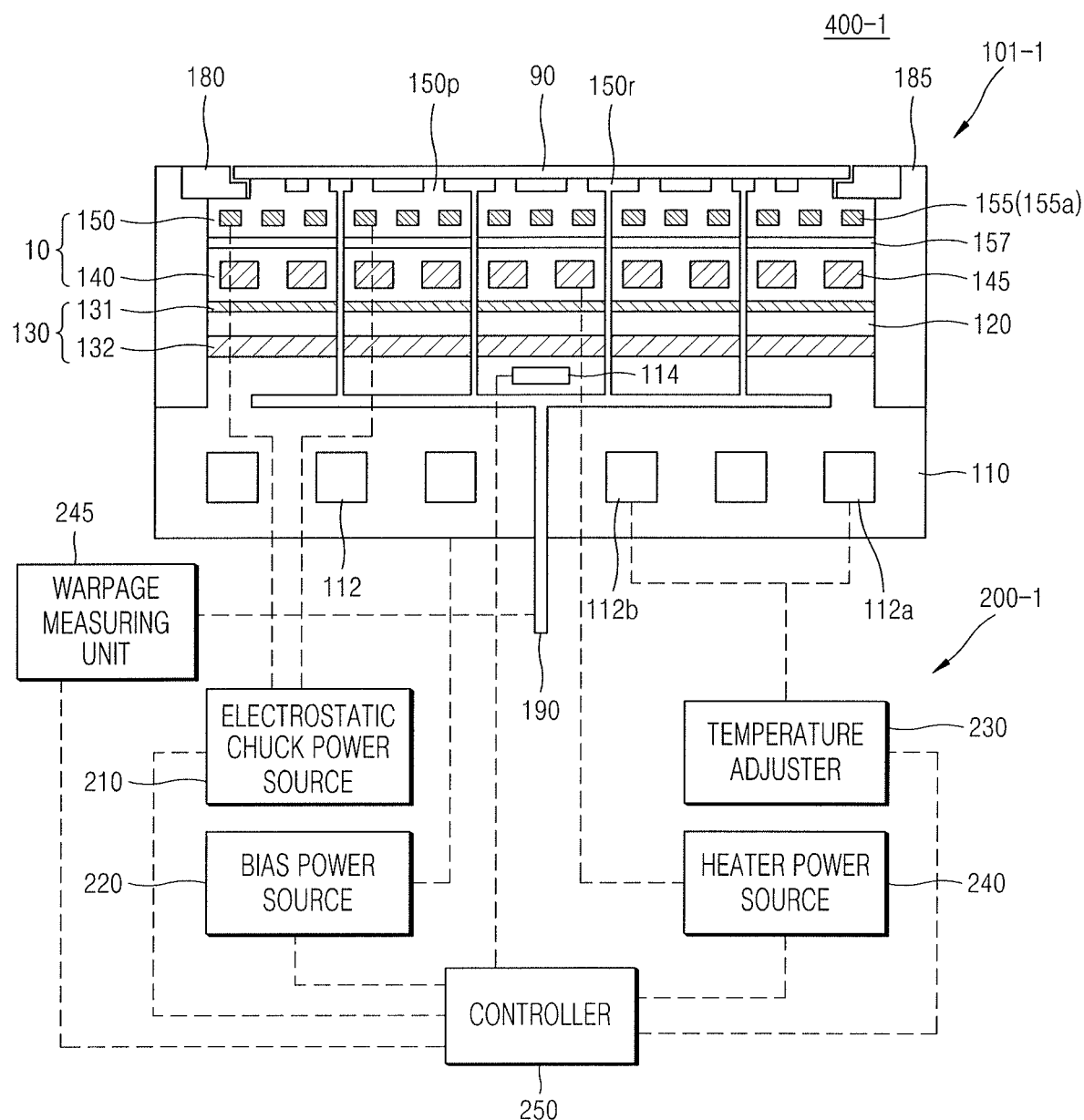
FIG. 10 illustrates a cross-sectional view of an electrostatic chuck assembly according to an embodiment.

FIG. 10 is a cross-sectional view of an electrostatic chuck assembly 400-1 according to an embodiment.

In detail, the electrostatic chuck assembly 400-1 may be the same as the electrostatic chuck assembly 400 of FIG. 1, except that in the electrostatic chuck assembly 400-1, a gas channel 190 is installed in an electrostatic chuck 101-1, a recess portion 150r connected to the gas channel 190 is formed in the top surface of the electrostatic dielectric layer 150, and a control part 200-1 includes a warpage measuring unit 245. Thus, in the description of FIG. 10, only a configuration different from that of the electrostatic chuck assembly 400 of FIG. 1 will be described and the same configuration will be briefly described or omitted.

The electrostatic chuck assembly 400-1 may include the electrostatic chuck 101-1 for adsorbing the wafer 90 thereon and the control part 200-1 for controlling the operation of the electrostatic chuck 101-1. The electrostatic chuck 101-1 may include the cooling channel 112, the base 110 in the form of a disk including the temperature sensor 114, the dielectric stack 10 bonded to the base 110 by the adhesive layer 130, the focus ring 180 provided around the edge of the wafer 90, and the outer ring 185. The dielectric stack 10 may include the heater dielectric layer 140 in which the heater electrode 145 is embedded and the electrostatic dielectric layer 150 in which the adsorption electrode 155 is embedded. The heat distribution layer 157 may be provided between the heater dielectric layer 140 and the electrostatic dielectric layer 150. The adhesive layer 130 may have a double layer structure including the first adhesive 131 and the second adhesive 132. The metal plate 120 may further be provided between the first adhesive 131 and the second adhesive 132.

The electrostatic chuck 101-1 may include the gas channel 190 that passes through the electrostatic chuck 101-1 to provide a thermally conductive gas to the wafer 90. At least one protrusion 150p that contacts the wafer 90, and at least one recess portion 150r that does not contact the wafer 90 may be formed on the top surface of the electrostatic dielectric layer 150.

The gas channel 190 may be connected to the recess portion 150r. The electrostatic chuck 101-1 may reduce the damage of the wafer 90 and realize uniform plasma processing, by adjusting the temperature of the wafer 90 by providing a thermally conductive gas through the recess portion 150r. The thermally conductive gas may be an inert gas, e.g., helium (He) or argon (Ar). The gas channel 190 may be formed by a mechanical machining process, e.g., drilling.

The control part 200-1 may include the electrostatic chuck power source 210, the bias power source 220, the temperature adjuster 230, the heater power source 240, the warpage measuring unit 245, and the controller 250. The warpage measuring unit 245 may measure the warpage of the wafer 90 based on the flow rate of a thermally conductive gas flowing through the gas channel 190. An electrostatic voltage that is applied to the adsorption electrodes 155 and 155a may be controlled through the controller 250 based on the warpage of the wafer 90, measured by the warpage measuring unit 245.

Figure 11:
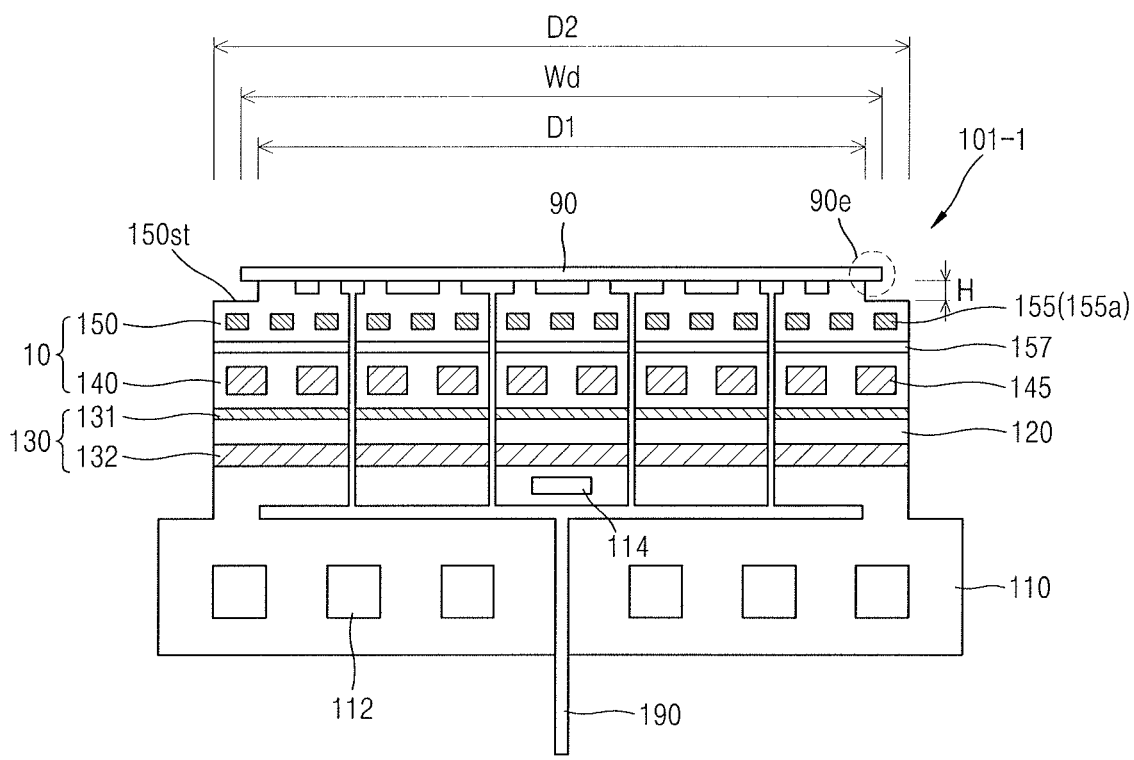
FIG. 11 illustrates a cross-sectional view of a part of the electrostatic chuck assembly of FIG. 10.
Figure 12:
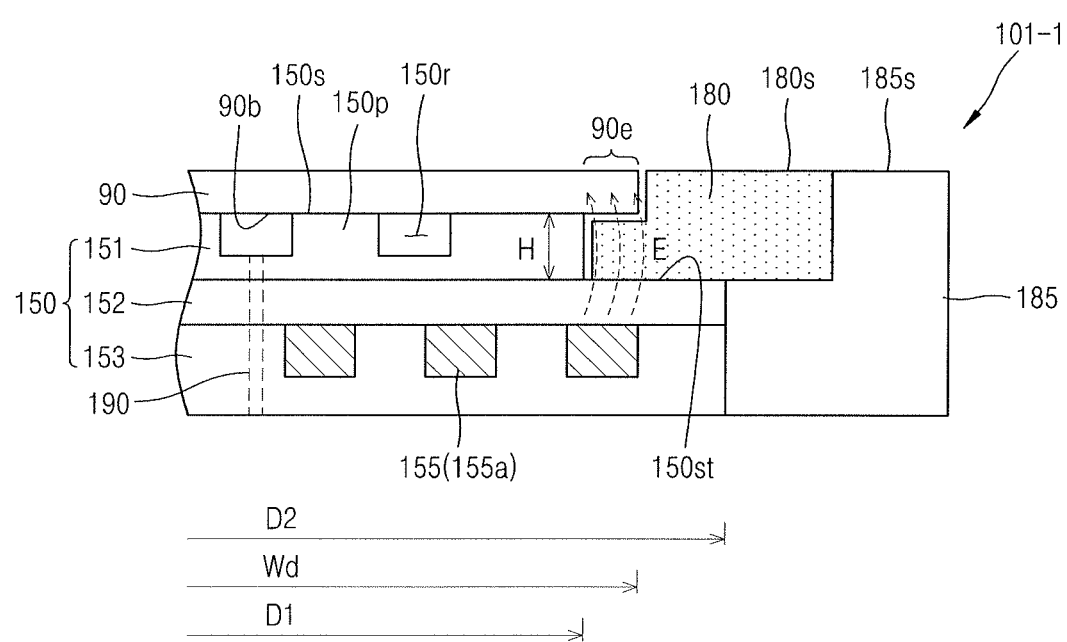
FIG. 12 illustrates an enlarged cross-sectional view of a part of FIG. 10.

FIG. 11 is a cross-sectional view of a part of the electrostatic chuck assembly 400-1 of FIG. 10, and FIG. 12 is an enlarged cross-sectional view of a part of FIG. 10.

In detail, the electrostatic chuck 101-1 of FIGS. 11 and 12 may be the same as the electrostatic chuck 101 of FIGS. 2 and 3, except that the gas channel 190 is installed. In the description of FIGS. 11 and 12, only a configuration different from that of the electrostatic chuck 100 of FIGS. 2 and 3 will be described and the same configuration will be briefly described or omitted.

The top surface 150s of the electrostatic dielectric layer 150 of FIGS. 11 and 12 may have an uneven structure having at least one protrusion 150p, which contacts the wafer 90, and at least one recess portion 150r having a bottom surface which does not contact the wafer 90. The gas channel 190 may be opened toward the recess portion 150r so that the recess portion 150r is filled with the thermally conductive gas. The thermally conductive gas filled in the recess portion 150r may contact the bottom surface 90b of the wafer 90 and thus may draw heat away from the wafer 90 or provide heat to the wafer 90.

Figure 13:
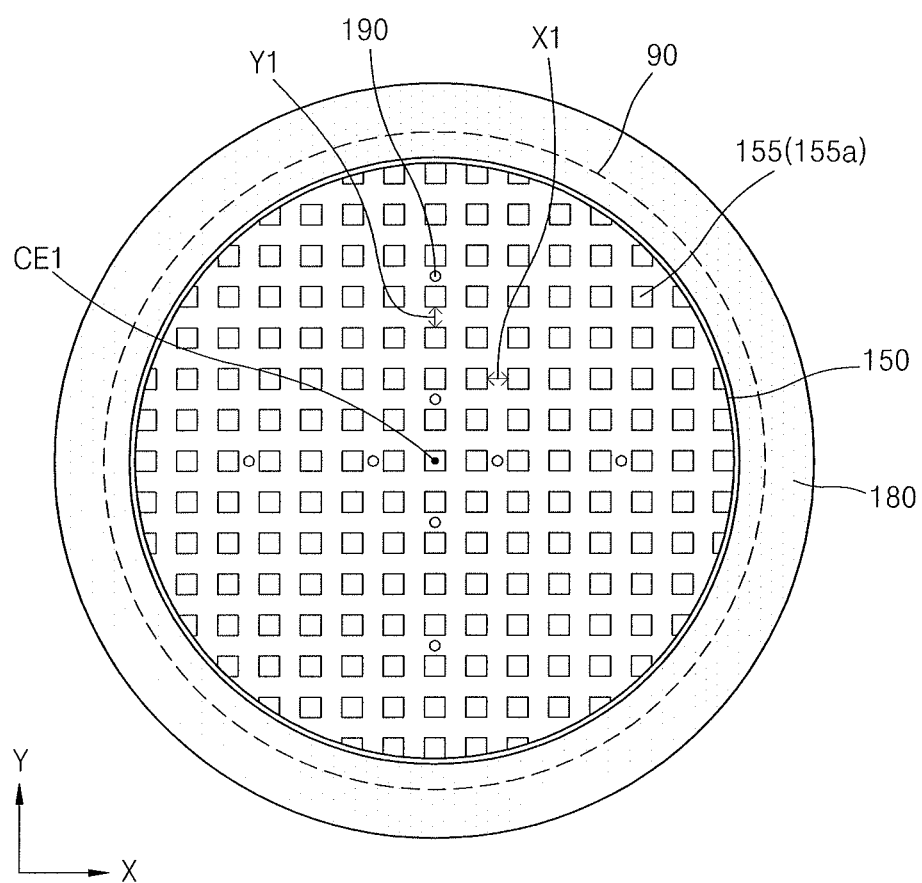
FIG. 13 illustrates a plan view of a wafer mounted on an electrostatic dielectric layer of an electrostatic chuck according to an embodiment.
Figure 14A:
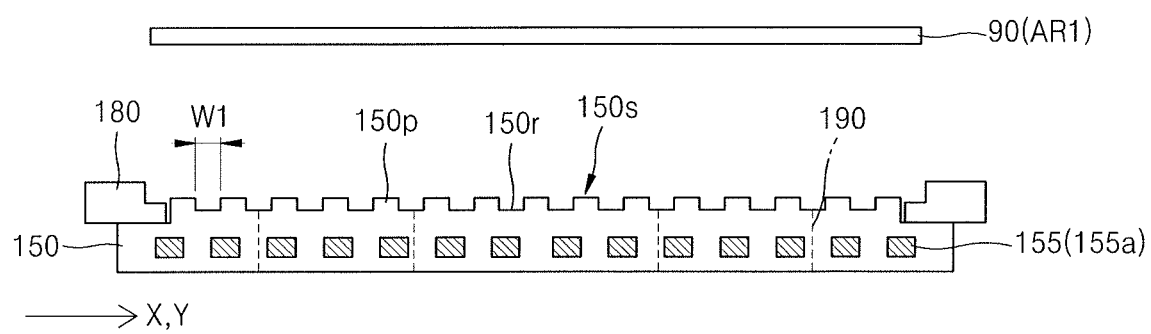
FIGS. 14A-14C illustrate exploded cross-sectional views of FIG. 13.
Figure 14B:
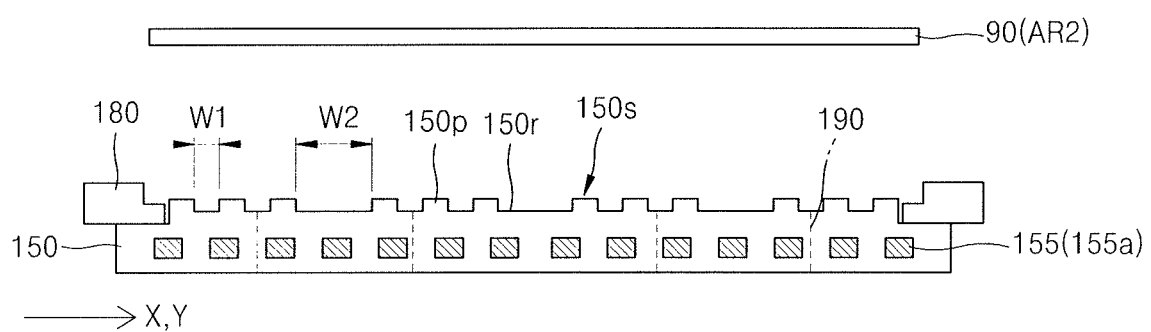
Figure 14C:
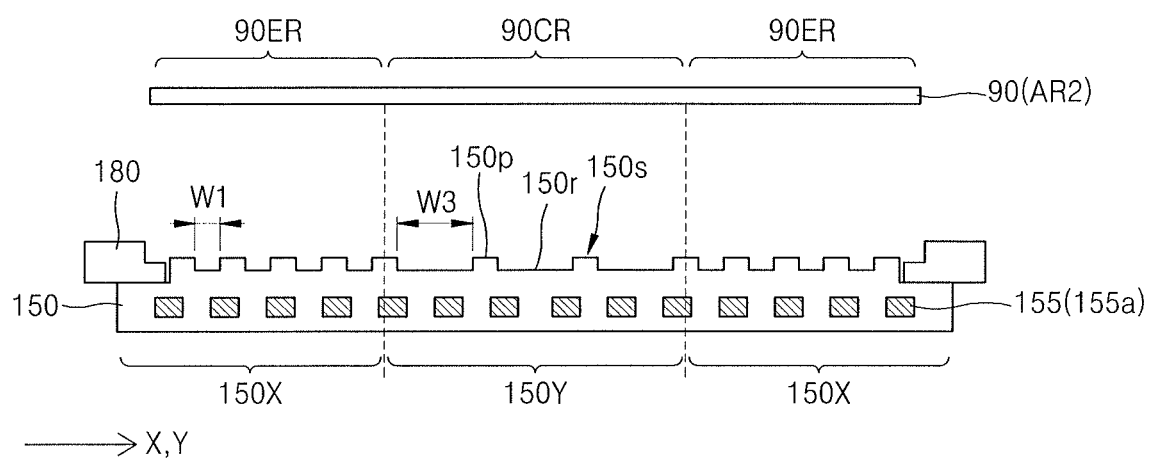

FIG. 13 is a plan view of the wafer 90 mounted on the electrostatic dielectric layer 150 of an electrostatic chuck according to an embodiment, and FIGS. 14A-14C are exploded cross-sectional views of FIG. 13.

In detail, as shown in FIG. 13, the adsorption electrode 155 may include the plurality of sub-adsorption electrodes 155a separated from each other by an interval X1 and an interval Y1 in the X direction and the Y direction perpendicular to the X direction on a plane level from the central portion CE1 of the electrostatic dielectric layer 150. The gas channel 190 may be located between the sub-adsorption electrodes 155a.

As shown in FIGS. 14A-14C, the surface of the electrostatic dielectric layer 150 may have the protrusion 150p and the recess portion 150r. The gas channel 190 may pass through the electrostatic dielectric layer 150 and be connected to the recess portion 150r.

A contact area between the protrusion 150p and the bottom surface 90b of the wafer 90 may be equal to or less than half the area of the bottom surface 90b of the wafer 90. For example, the contact area between the protrusion 150p and the bottom surface 90b of the wafer 90 may be ¹⁄₁₀₀ to ³⁰⁄₁₀₀ of the area of the bottom surface 90b of the wafer 90.

The top surfaces of the protrusions 150p may have the same level, and their heights may be equal to or different from each other. As shown in FIGS. 14A-14C, the depths of the recess portions 150r may be equal to each other. The bottom surfaces of the recess portions 150r may be at the same level. If necessary, the depths of the recess portions 150r may be different from each other. Any one of the bottom surfaces of the recess portions 150r may have a lower level than the other.

The wafer 90 shown in FIG. 14A may include a plurality of divided regions AR1 in the X direction and in the Y direction perpendicular to the X direction on a plane level from the central portion CE1, as shown in FIG. 5A. As shown in FIG. 14A, the widths w1 of the recess portions 150r may be equal to each other to correspond to the divided regions AR1, respectively.

The wafer 90 shown in FIG. 14B may include divided regions AR1 and AR2 having different sizes in the X-direction and the Y direction perpendicular to the X direction on a plane level from the central portion CE2, as shown in FIG. 6A. As shown in FIG. 14B, the widths w1 and w2 of the recess portions 150r may be different from each other to correspond to the divided regions AR1 and AR2.

As shown in FIGS. 9A, 9B, and 14C, the electrostatic dielectric layer 150 may include an inner region 150X corresponding to the central region 90CR of the wafer 90 mounted on the electrostatic dielectric layer 150, and an outer region 150Y corresponding to an edge region 90ER surrounding the central region 90CR of the wafer 90. The width w3 of the recess portions 150r formed in the inner region 150X may be greater than the width w1 of the recess portions 150r formed in the outer region 150Y. The arrangement of the widths w1, w2, and w3 of the recess portions 150r or the arrangement of the protrusion 150p may be variously changed.

Figure 15:
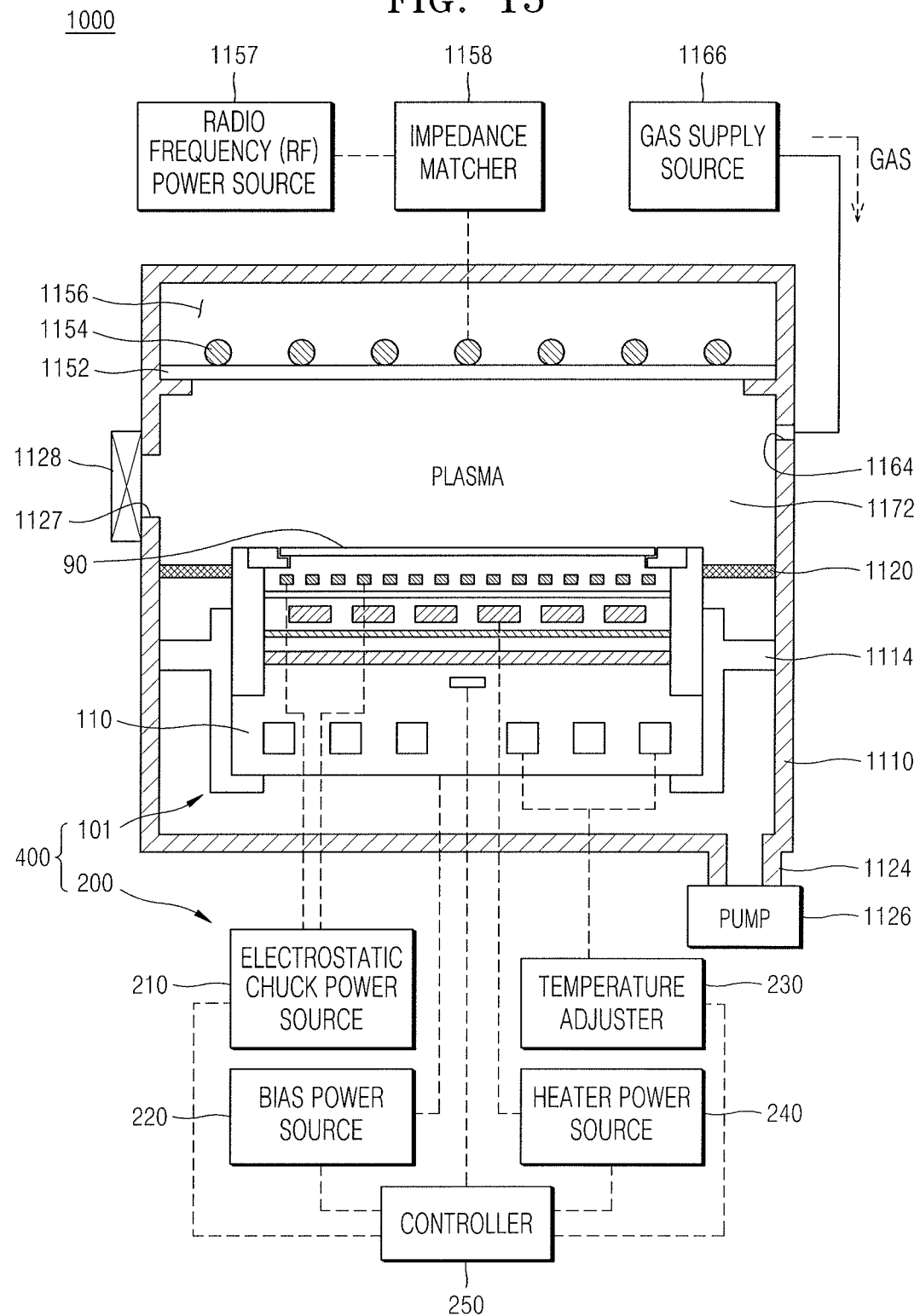
FIG. 15 illustrates a cross-sectional view of a semiconductor manufacturing apparatus including an electrostatic chuck assembly according to an embodiment.

FIG. 15 is a cross-sectional view of a semiconductor manufacturing apparatus 1000 including an electrostatic chuck assembly according to an embodiment.

In detail, the semiconductor manufacturing apparatus 1000 may be an inductively coupled plasma processing apparatus that performs wafer processing (e.g., plasma etching) for processing the wafer 90 on the electrostatic chuck 101 by using inductively coupled plasma (ICP) generated in an inductive coupling manner. The electrostatic chuck 101 may be used in an etching apparatus using capacitively coupled plasma (CCP) generated in a capacitive coupling manner. The semiconductor manufacturing apparatus 1000 may include the electrostatic chuck assembly 400, which includes the electrostatic chuck 101 for mounting the wafer 90, at the center of a lower portion of a cylindrical vacuum chamber 1110.

For example, the electrostatic chuck assembly 400 may include the control part 200. In another example, the electrostatic chuck 101-1 and the control part 200-1 of FIG. 10 may be employed in the semiconductor manufacturing apparatus 1000 instead of the electrostatic chuck 101 and the control part 200. The electrostatic chucks 101 and 101-1 and the control parts 200 and 200-1 have already been described with reference to FIG. 1 and FIG. 10, and thus, detailed descriptions thereof will be omitted.

The electrostatic chuck 101 may be supported by a supporting portion 1114 fixed to the inner wall of the vacuum chamber 1110. A baffle plate 1120 may be provided between the electrostatic chuck 101 and the inner wall of the vacuum chamber 1110. An exhaust pipe 1124 may be provided below the vacuum chamber 1110, and the exhaust pipe 1124 may be connected to the vacuum pump 1126. A gate valve 1128 may be provided on the outer wall of the vacuum chamber 1110 to open and close an opening 1127 for carrying in and carrying out the wafer 90.

A dielectric window 1152 spaced from the electrostatic chuck 101 may be provided on the ceiling of the vacuum chamber 1110. An antenna chamber 1156, which accommodates a high frequency antenna 1154, which has a coil shape such as a spiral or a concentric circle, on the dielectric window 1152, may be integrally provided with the vacuum chamber 1110. The high frequency antenna 1154 may be electrically connected to a radio frequency (RF) power source 1157 for generating plasma via an impedance matcher 1158. The RF power source 1157 may output a high frequency power suitable for plasma generation. The impedance matcher 1158 may be provided for matching the impedance of the RF power source 1157 to the impedance of a load, e.g., the high frequency antenna 1154.

A gas supply source 1166 may supply a process gas, such as an etch gas, to the vacuum chamber 1110 via a supply device 1164, such as a nozzle or a porthole, provided on the sidewall of the vacuum chamber 1110. In order to perform an etching process by using the semiconductor manufacturing apparatus 1000, the gate valve 1128 may be opened and the wafer 90 may be loaded (or mounted) on the electrostatic chuck 101 in the vacuum chamber 1110. The wafer 90 may be adsorbed onto the electrostatic chuck 101 by an electrostatic force generated by power application from the electrostatic chuck power source 210 to the electrostatic chuck 101.

An etching gas from the gas supply source 1166 may be introduced into the vacuum chamber 1110. In this case, the pressure in the vacuum chamber 1110 may be set to a predetermined value by the vacuum pump 1126. Power from the RF power source 1157 may be applied to the high frequency antenna 1154 via the impedance matcher 1158. In addition, power from the bias power source 220 may be applied to the base 110.

The etching gas introduced into the vacuum chamber 1110 may be uniformly diffused in a processing chamber 1172 under the dielectric window 1152. A magnetic field may be generated around the high frequency antenna 1154 by a current flowing in the high frequency antenna 1154 and a line of magnetic force may pass through the processing chamber 1172 through the dielectric window 1152. An induced electric field may be generated due to a temporal change of a magnetic field, and electrons accelerated by the induced electric field may collide with molecules or atoms of an etching gas to generate plasma.

In this manner, ions of plasma may be supplied to the wafer 90 by using a plasma generating unit, whereby wafer processing, that is, etching processing may be performed in the processing chamber 1172. The plasma generating unit may include the gas supply source 1166 for supplying a process gas to the process chamber 1172, the high frequency antenna 1154 provided in the antenna chamber 1156, and the RF power source 1157 for providing high frequency power to the high frequency antenna 1154.

Since the electrostatic chuck 101 has the step pattern 150st as described above, a uniform electric field may be applied over the entire wafer 90. Thus, the uniformity of the plasma treatment for the wafer 90 may be improved.

The electrostatic chuck 101 may include the plurality of sub-adsorption electrodes 155a (see FIGS. 1 to 4) separated from each other in the X direction and the Y direction on a plane level from a central portion of the electrostatic dielectric layer 150 (see FIGS. 1 to 4). As the arrangement of the sub-adsorption electrodes 155a is variously configured, the wafer 90 may be uniformly adsorbed onto the electrostatic dielectric layer 150 by applying electrostatic voltages having various magnitudes to the sub-adsorption electrodes 155a even if warpage of the wafer 90 occurs unevenly.

Hereinafter, a wafer processing method using the semiconductor manufacturing apparatus 1000 including the electrostatic chuck assembly 400 or 400-1 according to the embodiment will be described.

Figure 16:
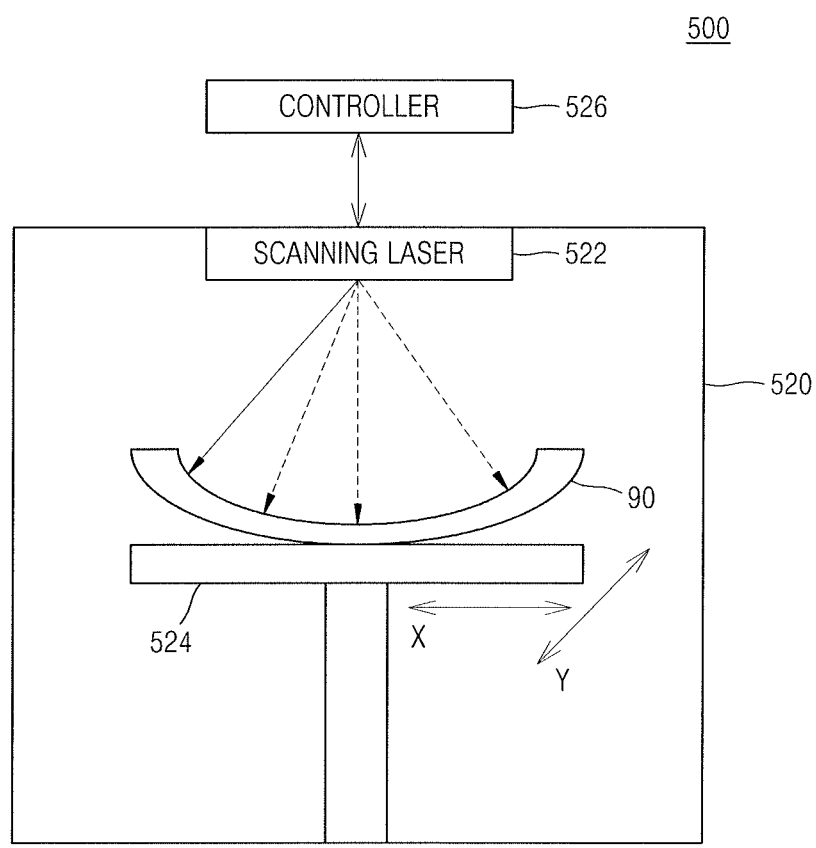
FIG. 16 illustrates a cross-sectional view of a warpage measuring apparatus used in a wafer processing method according to an embodiment.
Figure 17A:
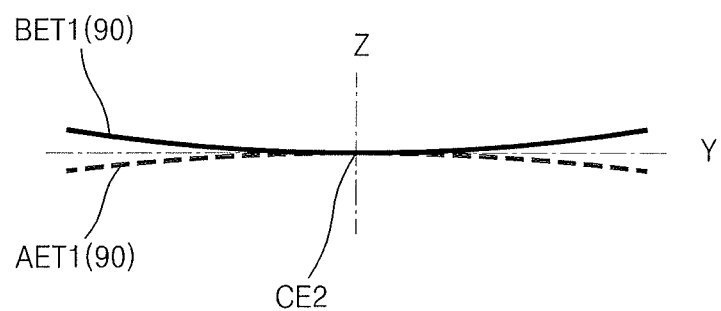
FIGS. 17A and 17B illustrate diagrams of wafer warpages before and after wafer processing, measured by the warpage measuring apparatus of FIG. 16.
Figure 17B:
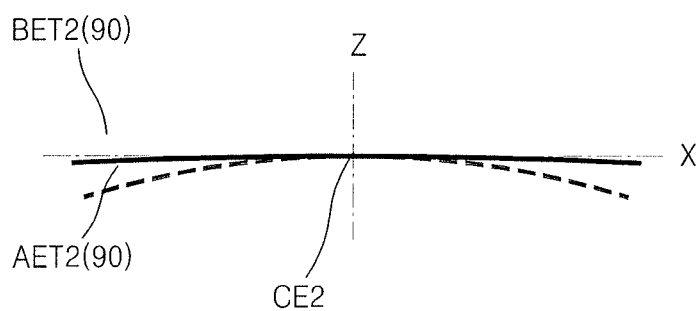

FIG. 16 is a cross-sectional view of a warpage measuring apparatus 500 used in a wafer processing method according to an embodiment, and FIGS. 17A and 17B are diagrams showing wafer warpages before and after wafer processing, measured by the warpage measuring apparatus 500 of FIG. 16.

In detail, the warpage measuring apparatus 500 of FIG. 16 may include a measurement chamber 520, a stage 524 on which the wafer 90 is mounted and which moves the wafer 90 in the X and Y directions, a scanning laser 522 for radiating a laser onto the wafer 90 and measuring a surface height of the wafer 90, i.e., warpage, and a controller 526 for controlling the scanning laser 522 and the stage 524. The warpage measuring apparatus 500 may measure surface heights (i.e., warpage) at each region or each point of the wafer 90.

FIGS. 17A and 17B show the warpages of the wafer 90 measured in the Y-axis and the X-axis, respectively. In FIGS. 17A and 17B, the Z axis represents a surface height of the wafer 90, i.e., warpage.

In an embodiment, as shown in FIG. 17A, the warpage BET1 of the wafer 90 before wafer processing, e.g., before etching of a stacked insulating layer in which an oxide layer and a nitride layer are sequentially stacked, may be concave on both sides with respect to a central portion CE2 of the wafer 90. As shown in FIG. 17A, the warpage AET1 of the wafer 90 after the wafer processing, e.g., after the etching of the stacked insulating layer in which an oxide layer and a nitride layer are sequentially stacked, may be convex on both sides with respect to the central portion CE2 of the wafer 90.

In an embodiment, as shown in FIG. 17B, the warpage BET2 of the wafer 90 before wafer processing, e.g., before etching of a stacked insulating layer in which an oxide layer and a nitride layer are sequentially stacked, may be slightly convex on both sides with respect to a central portion CE2 of the wafer 90. As shown in FIG. 17B, the warpage AET2 of the wafer 90 after the wafer processing, for example, after the etching of the stacked insulating layer in which an oxide layer and a nitride layer are sequentially stacked, may be more convex on both sides with respect to the central portion CE2 of the wafer 90 than before the wafer processing. As described above, since the warpage of a wafer before and after wafer processing is variously changed, it is necessary to adjust the warpage of the wafer during the wafer processing.

Figure 18A:
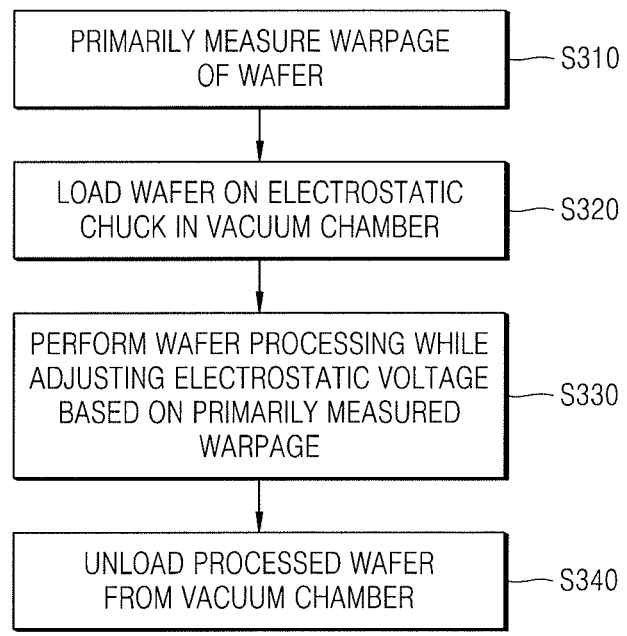
FIGS. 18A and 18B illustrate flow charts of a wafer processing method using a semiconductor manufacturing apparatus including an electrostatic chuck assembly according to an embodiment.
Figure 18B:
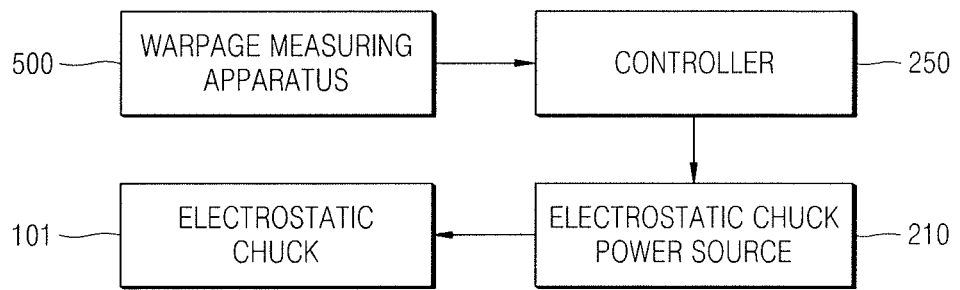

FIGS. 18A and 18B are diagrams for explaining a wafer processing method using a semiconductor manufacturing apparatus including an electrostatic chuck assembly according to an embodiment.

In detail, FIGS. 18A and 18B are diagrams for explaining a wafer processing method using the semiconductor manufacturing apparatus 1000 including the electrostatic chuck assembly 400 described with respect to FIGS. 1 and 15. FIG. 18A is a flowchart for explaining the wafer pressing method, and FIG. 18B is a block diagram for explaining a method of controlling an electrostatic chuck at the time of wafer processing.

The wafer processing method includes primarily measuring the warpage of a wafer before wafer processing (Operation S310). The primary measurement of the warpage of the wafer may be performed using the warpage measuring apparatus 500 described above with reference to FIGS. 16, 17A and 17B. The warpage of the wafer may appear in various forms as shown in FIGS. 17A and 17B.

The wafer is loaded on the electrostatic chuck 101 in the vacuum chamber 1110 of the semiconductor manufacturing apparatus 1000 (see FIG. 15) after the primary measurement of the warpage of the wafer (Operation S320). The wafer processing is performed while adjusting an electrostatic voltage applied to the electrostatic chuck 101 based on the primarily measured warpage (Operation S330).

An electrical signal relating to the warpage primarily measured by the warpage measuring apparatus 500 is provided to the controller 250 of the electrostatic chuck assembly 400 as shown in FIG. 18B. The controller 250 adjusts the electrostatic voltage of the electrostatic chuck 101 applied through the electrostatic chuck power source 210, based on the electrical signal relating to the warpage primarily measured by the warpage measuring apparatus 500. By adjusting the electrostatic voltage applied to the electrostatic chuck 101, the warpage of the wafer may be adjusted and the wafer may be well adsorbed onto the electrostatic chuck 101 during the wafer processing.

Subsequently, a processed wafer is unloaded from the vacuum chamber (Operation S340). Through the above process, the wafer processing method according to the embodiment may perform the wafer processing in a state in which the wafer is well adsorbed onto the electrostatic chuck.

Figure 19A:
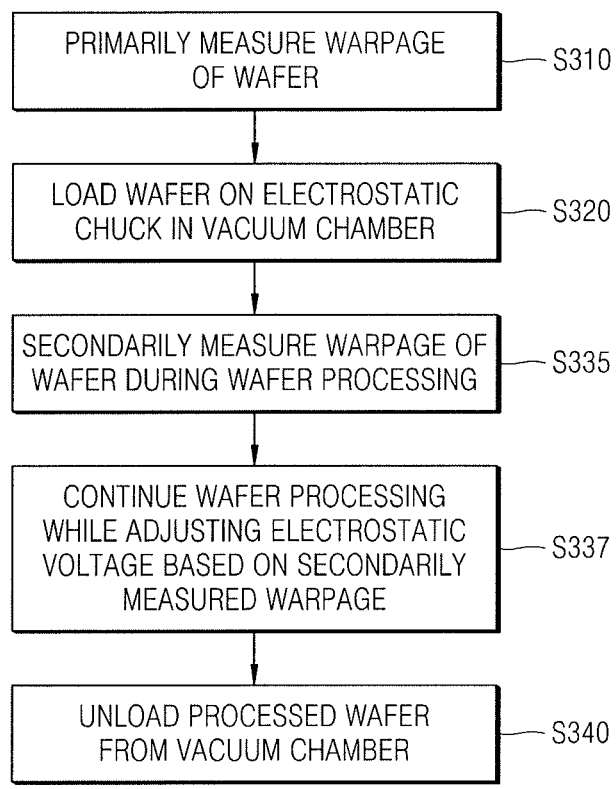
FIGS. 19A and 19B illustrate flow charts of a wafer processing method using a semiconductor manufacturing apparatus including an electrostatic chuck assembly according to an embodiment.
Figure 19B:
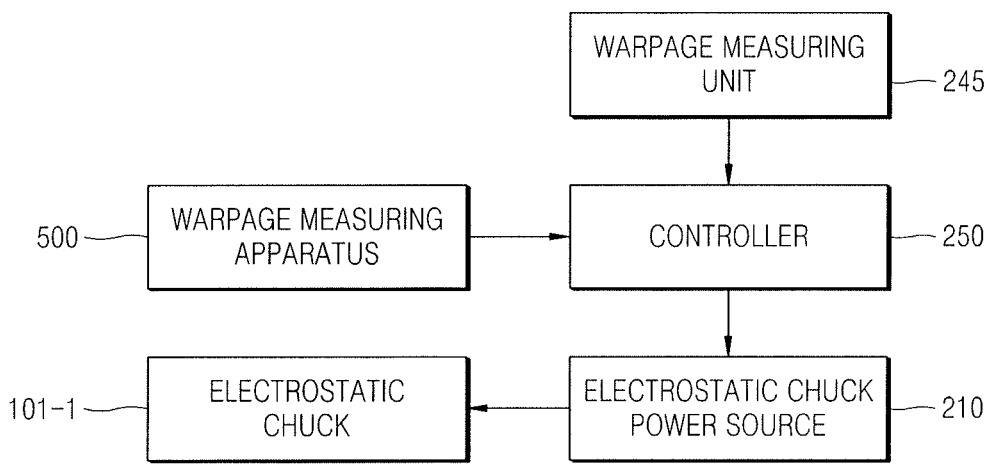

FIGS. 19A and 19B are diagrams for explaining a wafer processing method using a semiconductor manufacturing apparatus including an electrostatic chuck assembly according to an embodiment.

In detail, FIGS. 19A and 19B are diagrams for explaining a wafer processing method using the semiconductor manufacturing apparatus 1000 including the electrostatic chuck assembly 400-1 described with reference to FIGS. 10 and 15. FIG. 19A is a flowchart for explaining the wafer pressing method, and FIG. 19B is a block diagram for explaining a method of controlling an electrostatic chuck during wafer processing.

The wafer processing method includes primarily measuring the warpage of a wafer before the wafer processing, as described with reference to FIGS. 18A and 18B (Operation S310). The primary measurement of the warpage of the wafer may be performed using the warpage measuring apparatus 500 described above with reference to FIGS. 16, 17A and 17B. The warpage of the wafer may appear in various forms as shown in FIGS. 17A and 17B.

The wafer is loaded on the electrostatic chuck 101 (or 101-1 in FIG. 10) in the vacuum chamber 1110 of the semiconductor manufacturing apparatus 1000 (see FIG. 15) after the primary measurement of the warpage of the wafer (Operation S320). During wafer processing while adjusting an electrostatic voltage applied to the electrostatic chuck 101 or 101-1 based on the primarily measured warpage, the warpage of the wafer is secondarily measured through the warpage measuring unit 245 of the electrostatic chuck assembly 400-1 of FIG. 10 (Operation S335).

An operation of adjusting the electrostatic voltage applied to the electrostatic chuck 101 or 101-1 based on the primarily measured warpage is the same as that described above with reference to FIGS. 18A and 18B. The secondary measurement of the warpage of the wafer is performed using the warpage measuring unit 245. As described above, the warpage measuring unit 245 may secondarily measure the warpage of the wafer based on the flow rate of a thermally conductive gas flowing through a gas channel.

The wafer processing is continued while adjusting the electrostatic voltage applied to the electrostatic chuck 101 or 101-1 based on the secondarily measured warpage (Operation S337). An electrical signal relating to the warpage measured secondarily by the warpage measuring unit 245 is provided to the controller 250 of the electrostatic chuck assembly 400 as shown in FIG. 19B.

The controller 250 adjusts the electrostatic voltage of the electrostatic chuck 101 or 101-1, applied through the electrostatic chuck power source 210, based on the electric signal relating to the warpage measured secondarily by the warpage measuring unit 245. By adjusting the electrostatic voltage applied to the electrostatic chuck 101 or 101-1, the warpage of the wafer may be adjusted and the wafer may be well adsorbed onto the electrostatic chuck 101 or 101-1 during the wafer processing.

Subsequently, a processed wafer is unloaded from the vacuum chamber 1110 (Operation S340). Through the above process, the wafer processing method according to the embodiment may perform the wafer processing in a state in which the wafer is well adsorbed onto the electrostatic chuck.

By way of summation and review, there is a need for an electrostatic chuck assembly that is capable of uniformly chucking (fixing) a wafer despite wafer warpage that occurs as the diameter of the wafer increases. Therefore, embodiments provide an electrostatic chuck assembly for uniformly chucking (fixing) a wafer despite wafer warpage. Embodiments also provide a semiconductor manufacturing apparatus having the electrostatic chuck assembly.

That is, as described in the above, an electrostatic chuck of an electrostatic chuck assembly according to embodiments may include a plurality of sub-adsorption electrodes spaced apart from each other in an X direction and a Y direction on a plane level from a central portion of an electrostatic dielectric layer. In such an electrostatic chuck assembly, as the arrangement of the sub-adsorption electrodes is variously configured, a wafer may be uniformly adsorbed onto the electrostatic dielectric layer by applying electrostatic voltages having various magnitudes to the sub-adsorption electrodes even if the warpage of the wafer occurs unevenly, i.e., asymmetrically.

In addition, the electrostatic chuck assembly according to embodiments may include a gas channel passing through the electrostatic chuck and a control part including a warpage measuring unit for measuring the warpage of a wafer based on the flow rate of a gas flowing through the gas channel. Accordingly, the electrostatic chuck assembly may control, through a controller, an electrostatic voltage applied to an adsorption electrode based on the warpage of the wafer measured by the warpage measuring unit.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An electrostatic chuck assembly, comprising:
an electrostatic chuck including a circular-shaped electrostatic dielectric layer, on which a wafer is mounted, and an adsorption electrode in the circular-shaped electrostatic dielectric layer; and
a control part to control the electrostatic chuck,
wherein the adsorption electrode includes a plurality of sub-adsorption electrodes separated from each other in an X direction and a Y direction perpendicular to the X direction on a plane level from a central portion of the circular-shaped electrostatic dielectric layer,
wherein a bottom portion of the circular-shaped electrostatic dielectric layer protrudes beyond a top portion of the circular-shaped electrostatic dielectric layer, at least one of the plurality of sub-adsorption electrodes extending laterally beyond the top portion of the circular-shaped electrostatic dielectric layer,
the circular-shaped electrostatic dielectric layer includes an inner region corresponding to a central region of the wafer mounted on the circular-shaped electrostatic dielectric layer, and an outer region corresponding to an edge region surrounding the central region of the wafer, and
a separation distance between sub-adsorption electrodes arranged in the inner region is different from a separation distance between sub-adsorption electrodes arranged in the outer region.

2. The electrostatic chuck assembly as claimed in claim 1, wherein the sub-adsorption electrodes are separated from each other at equal separation distances in the X or Y direction.

3. The electrostatic chuck assembly as claimed in claim 1, wherein the sub-adsorption electrodes are separated from each other at different separation distances in the X or Y direction.

4. The electrostatic chuck assembly as claimed in claim 1, wherein:
the wafer mounted on the circular-shaped electrostatic dielectric layer includes a plurality of divided regions defined to have a same area in the X direction and the Y direction, and
the sub-adsorption electrodes are arranged at equal separation distances to respectively correspond to the plurality of divided regions.

5. The electrostatic chuck assembly as claimed in claim 1, wherein:
the wafer mounted on the circular-shaped electrostatic dielectric layer includes a plurality of divided regions defined to have different areas in the X direction and the Y direction, and
the sub-adsorption electrodes are arranged at different separation distances to respectively correspond to the plurality of divided regions.

6. The electrostatic chuck assembly as claimed in claim 1, wherein:
the circular-shaped electrostatic dielectric layer includes an inner region corresponding to a central region of the wafer mounted on the circular-shaped electrostatic dielectric layer, and an outer region corresponding to an edge region surrounding the central region of the wafer, and
a dielectric constant of the inner region of the circular-shaped electrostatic dielectric layer is different from a dielectric constant of the outer region of the circular-shaped electrostatic dielectric layer.

7. The electrostatic chuck assembly as claimed in claim 1, wherein the control part includes:
an electrostatic chuck power source to apply an electrostatic voltage to the wafer; and
a controller to adjust an electrostatic voltage, which is applied to the electrostatic chuck through the electrostatic chuck power source, according to warpage of the wafer measured in advance by a wafer warpage measuring apparatus.

8. The electrostatic chuck assembly as claimed in claim 1, wherein:
a top surface of the circular-shaped electrostatic dielectric layer includes at least one protrusion that contacts the wafer, and at least one recess portion that does not contact the wafer, and
a gas channel is connected to the at least one recess portion to provide a thermally conductive gas through the electrostatic chuck to control a temperature of the wafer.

9. The electrostatic chuck assembly as claimed in claim 8, wherein:
the wafer includes a plurality of divided regions defined in the X direction and the Y direction, and
the at least one recess portion includes a plurality of recess portions having same widths to respectively correspond to the plurality of divided regions.

10. The electrostatic chuck assembly as claimed in claim 8, wherein:
the wafer includes a plurality of divided regions defined in the X direction and the Y direction, and
the at least one recess portion includes a plurality of recess portions having different widths to respectively correspond to the plurality of divided regions.

11. The electrostatic chuck assembly as claimed in claim 10, wherein:
the circular-shaped electrostatic dielectric layer includes an inner region corresponding to a central region of the wafer mounted on the electrostatic dielectric layer, and an outer region corresponding to an edge region surrounding the central region of the wafer, and
the at least one recess portion includes a plurality of recess portions, widths of recess portions in the inner region being greater than widths of recess portions in the outer region.

12. The electrostatic chuck assembly as claimed in claim 8, wherein the control part includes a warpage measuring unit to measure warpage of the wafer based on a flow rate of the thermally conductive gas flowing through the gas channel.

13. The electrostatic chuck assembly as claimed in claim 12, wherein the control part includes:
an electrostatic chuck power source to apply an electrostatic voltage to the wafer; and
a controller to adjust an electrostatic voltage, which is applied to the electrostatic chuck through the electrostatic chuck power source, according to warpage of the wafer measured by the warpage measuring unit.

14. The electrostatic chuck assembly as claimed in claim 8, wherein:
the electrostatic chuck includes a base, and
a heater dielectric layer including an embedded heater electrode is provided on the base, and a cooling channel is provided in the base to provide a path of cooling fluid circulating in the base.

15. An electrostatic chuck, comprising:
an electrostatic dielectric layer on a base, the electrostatic dielectric layer to support a wafer; and
an adsorption electrode within the electrostatic dielectric layer, the adsorption electrode including a plurality of sub-adsorption electrodes completely separated from each other in an X direction and a Y direction perpendicular to the X direction, an arrangement of the subadsorption electrodes within the electrostatic dielectric layer overlapping center and edge portions of the electrostatic dielectric layer, and bottom surfaces of all the sub-adsorption electrodes being substantially level with each other and parallel to a bottom surface of the electrostatic dielectric layer,
the electrostatic dielectric layer includes an inner region corresponding to a central region of the wafer mounted on the electrostatic dielectric layer, and an outer region corresponding to an edge region surrounding the central region of the wafer, and
a separation distance between sub-adsorption electrodes arranged in the inner region is different from a separation distance between sub-adsorption electrodes arranged in the outer region.

16. The electrostatic chuck as claimed in claim 15, wherein a bottom portion of the electrostatic dielectric layer protrudes beyond a top portion of the electrostatic dielectric layer, the adsorption electrode including at least one sub-adsorption electrode in a part of the bottom portion of the electrostatic dielectric layer that protrudes beyond the top portion of the electrostatic dielectric layer.

17. The electrostatic chuck as claimed in claim 15, wherein a bottom portion of the electrostatic dielectric layer protrudes beyond a top portion of the electrostatic dielectric layer, at least one sub-adsorption electrode extending laterally beyond the top portion of the electrostatic dielectric layer.

18. The electrostatic chuck as claimed in claim 15, wherein each of the sub-adsorption electrodes is independently connected to a control part.

\* \* \* \* \*